(12) United States Patent
Itou et al.

(10) Patent No.: US 11,996,437 B2
(45) Date of Patent: May 28, 2024

(54) DISPLAY DEVICE

(71) Applicant: Japan Display Inc., Tokyo (JP)

(72) Inventors: Osamu Itou, Tokyo (JP); Jin Hirosawa, Tokyo (JP)

(73) Assignee: Japan Display Inc., Tokyo (JP)

( * ) Notice: Subject to any disclaimer, the term of this patent is extended or adjusted under 35 U.S.C. 154(b) by 485 days.

(21) Appl. No.: 17/318,038

(22) Filed: May 12, 2021

(65) Prior Publication Data
US 2021/0265420 A1 Aug. 26, 2021

Related U.S. Application Data

(63) Continuation of application No. PCT/JP2019/037089, filed on Sep. 20, 2019.

(30) Foreign Application Priority Data

Nov. 15, 2018 (JP) ................. 2018-215038

(51) Int. Cl.
| H01L 27/15 | (2006.01) |
| H01L 33/10 | (2010.01) |
| H01L 33/38 | (2010.01) |
| H01L 33/50 | (2010.01) |

(52) U.S. Cl.
CPC ............ H01L 27/156 (2013.01); H01L 33/10 (2013.01); H01L 33/382 (2013.01); H01L 33/502 (2013.01)

(58) Field of Classification Search
CPC ..... H01L 33/10; H01L 33/382; H01L 33/502; H01L 33/60; H01L 33/504; G09F 9/302
See application file for complete search history.

(56) References Cited

U.S. PATENT DOCUMENTS

| 2016/0240592 | A1* | 8/2016 | Li ...................... H10K 59/353 |
| 2017/0139276 | A1 | 5/2017 | Ulmer et al. |
| 2017/0294479 | A1 | 10/2017 | Cha et al. |
| 2018/0074372 | A1 | 3/2018 | Takeya et al. |
| 2018/0308420 | A1 | 10/2018 | Shin et al. |

FOREIGN PATENT DOCUMENTS

| JP | S61-087381 A | 5/1986 |
| JP | 2006-013157 A | 1/2006 |

OTHER PUBLICATIONS

Japanese Office Action dated Jul. 12, 2022 in corresponding Japanese Application No. 2018-215038.
International Search Report of the ISA dated Nov. 26, 2019 in connection with PCT/JP2019/037089.

* cited by examiner

*Primary Examiner* — Syed I Gheyas
(74) *Attorney, Agent, or Firm* — K&L Gates LLP

(57) ABSTRACT

A display device comprising: a first substrate; a plurality of pixels provided to the first substrate; a light emitting element comprising a light emitting element substrate provided over the pixels and a plurality of light emitting parts provided to the light emitting element substrate corresponding to the respective pixels; an anode electrode provided to the first substrate and electrically coupled to the light emitting element; and a plurality of phosphor layers provided to the respective light emitting parts and each covering at least part of the corresponding light emitting part.

14 Claims, 23 Drawing Sheets

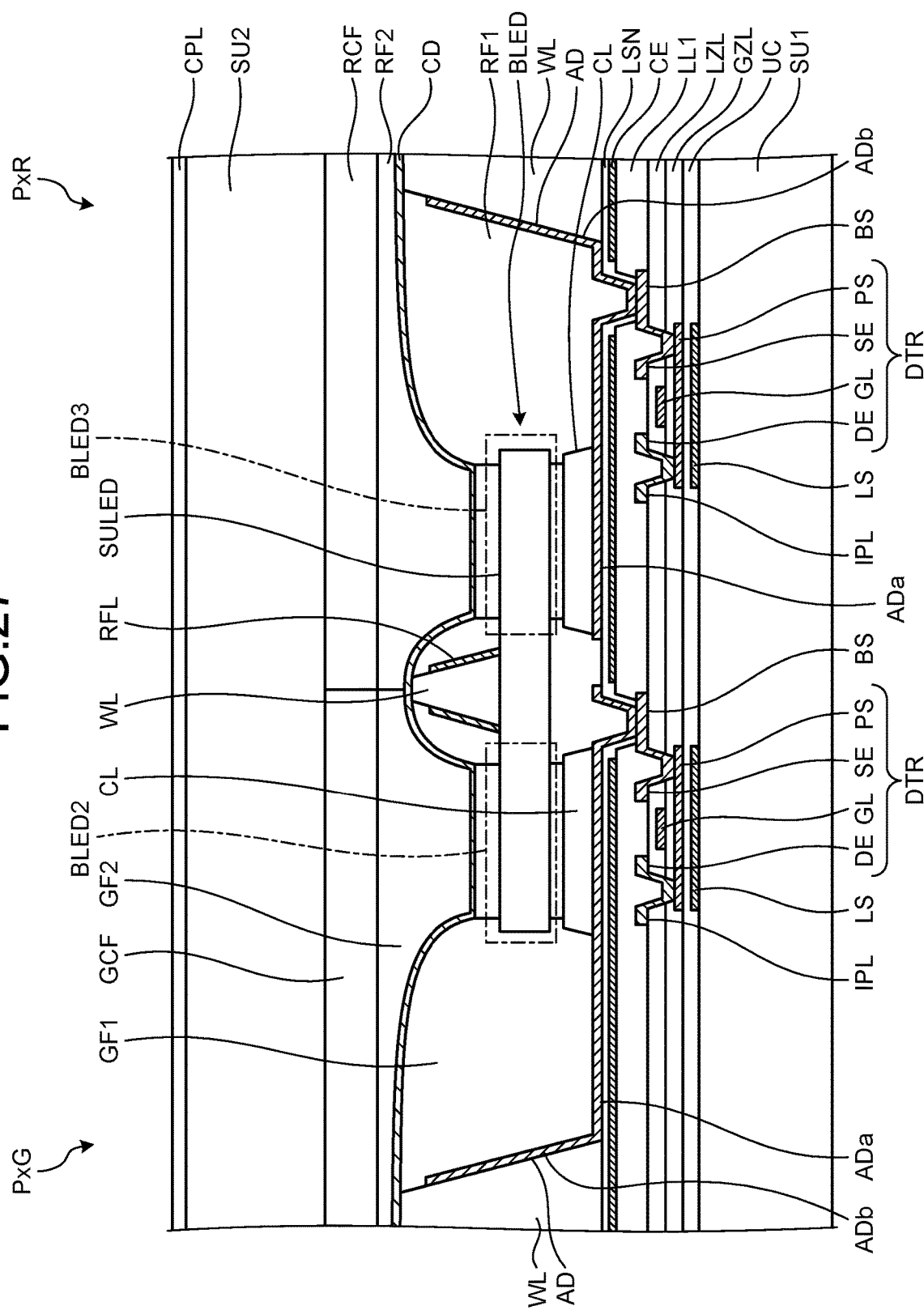

US 11,996,437 B2

DISPLAY DEVICE

CROSS-REFERENCE TO RELATED APPLICATION

This application is a continuation of PCT international application Ser. No. PCT/JP2019/037089 filed on Sep. 20, 2019 which designates United States, incorporated herein by reference, and which claims the benefit of priority from Japanese Patent Application No. 2018-215038 filed on Nov. 15, 2018, incorporated herein by reference.

BACKGROUND

1. Technical Field

The present disclosure relates to a display device.

2. Description of the Related Art

Widely known are display devices including organic light emitting diodes (OLED) or inorganic light emitting diodes (micro LEDs) serving as display elements. Micro LEDs are suitably used as light emitting elements for display devices because they are small in size and have high luminance. In the semiconductor device described in Japanese Patent Application Laid-open Publication No. S61-87381, light emitting elements that output light in different colors are provided on a single semiconductor substrate. The display device described in U.S. Unexamined Patent Application Publication No. 2017/0139276 uses blue light emitting diodes for pixels that display red or green. Light output from the blue light emitting diode is converted into red or green light by a light conversion structure.

In display devices including micro LEDs, the micro LEDs need to be disposed corresponding to respective pixels on a substrate. If the display devices are designed to have higher definition, it may possibly be difficult to dispose the micro LEDs on the substrate.

SUMMARY

A display device according to an embodiment of the present disclosure includes a first substrate, a plurality of pixels provided to the first substrate; a light emitting element comprising a light emitting element substrate provided over the pixels and a plurality of light emitting parts provided to the light emitting element substrate corresponding to the respective pixels, an anode electrode provided to the first substrate and electrically coupled to the light emitting element, and a plurality of phosphor layers provided to the respective light emitting parts and each covering at least part of the corresponding light emitting part.

BRIEF DESCRIPTION OF THE DRAWINGS

FIG. 27 is a sectional view of the display device according to a thirteenth modification of the third embodiment.

DETAILED DESCRIPTION

Figure 1:
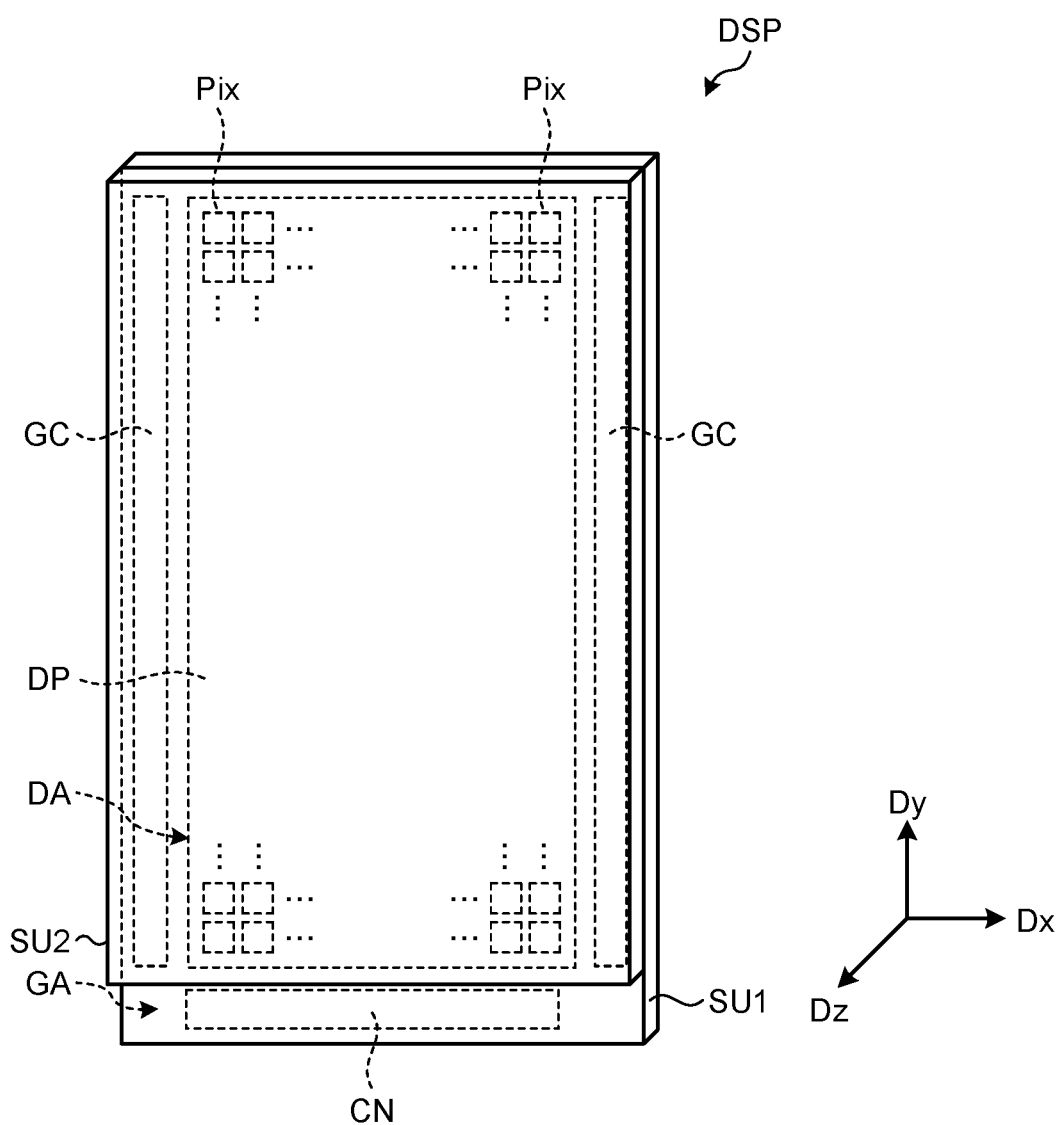
FIG. 1 is a perspective view schematically illustrating a display device according to a first embodiment.

Exemplary aspects (embodiments) to embody the present disclosure are described below in greater detail with reference to the accompanying drawings. The contents described in the embodiments are not intended to limit the present disclosure. Components described below include components easily conceivable by those skilled in the art and components substantially identical therewith. Furthermore, the components described below may be appropriately combined. What is disclosed herein is given by way of example only, and appropriate changes made without departing from the spirit of the present disclosure and easily conceivable by those skilled in the art naturally fall within the scope of the disclosure. To simplify the explanation, the drawings may possibly illustrate the width, the thickness, the shape, and other elements of each unit more schematically than the actual aspect. These elements, however, are given by way of example only and are not intended to limit interpretation of the present disclosure. In the present specification and the figures, components similar to those previously described with reference to previous figures are denoted by like reference numerals, and detailed explanation thereof may be appropriately omitted.

First Embodiment

FIG. 1 is a perspective view schematically illustrating a display device according to a first embodiment. As illustrated in FIG. 1, a display device DSP includes a first substrate SU1, a second substrate SU2, pixels Pix, peripheral circuits GC, and a coupler CN. FIG. 1 illustrates the configuration on the first substrate SU1 in a transparent manner. The first substrate SU1, a plurality of transistors, a plurality of capacitances, various kinds of wiring, and other components constitute an array substrate SUA that drives the pixels Pix. The array substrate SUA is a drive circuit board and is also called a backplane or an active matrix substrate. A drive integrated circuit (IC) is coupled to the array substrate SUA via the coupler CN.

As illustrated in FIG. 1, the display device DSP has a display region DA and a peripheral region GA. The display region DA overlaps a display portion DP and displays an image. The peripheral region GA does not overlap the display portion DP and is disposed outside the display region DA. The second substrate SU2 overlaps the first substrate SU1 in the display portion DP.

The display portion DP includes a plurality of pixels Pix. The pixels Pix are arrayed in a first direction Dx and a second direction Dy in the display region DA. The first direction Dx and the second direction Dy are parallel to the surface of the first substrate SU1. The first direction Dx is orthogonal to the second direction Dy. The first direction Dx may intersect the second direction Dy without being orthogonal thereto. A third direction Dz is orthogonal to the first direction Dx and the second direction Dy. The third direction Dz corresponds to the normal direction of the first substrate SU1, for example. In the following description, planar view indicates the positional relation when viewed in the third direction Dz.

The peripheral circuits GC and the coupler CN are provided in the peripheral region GA. The coupler CN is provided in a region not overlapping the second substrate SU2 in the peripheral region GA. The peripheral circuits GC drive a plurality of gate lines (e.g., a reset control signal line RSL, an output control signal line MSL, a pixel control signal line SSL, and an initialization control signal line ISL (refer to FIG. 3)) based on various control signals received from the drive IC. The peripheral circuits GC sequentially or simultaneously select a plurality of gate lines and supply gate drive signals to the selected gate lines. As a result, the peripheral circuits GC select a plurality of pixels Pix coupled to the gate lines.

The drive IC is a circuit that controls display on the display device DSP. The drive IC may be mounted on FPCs or a rigid substrate coupled to the coupler CN of the first substrate SU1 as chip on film (COF). The mounting form of the drive IC is not limited thereto, and the drive IC may be mounted on the peripheral region GA of the first substrate SU1 as chip on glass (COG).

Figure 2:
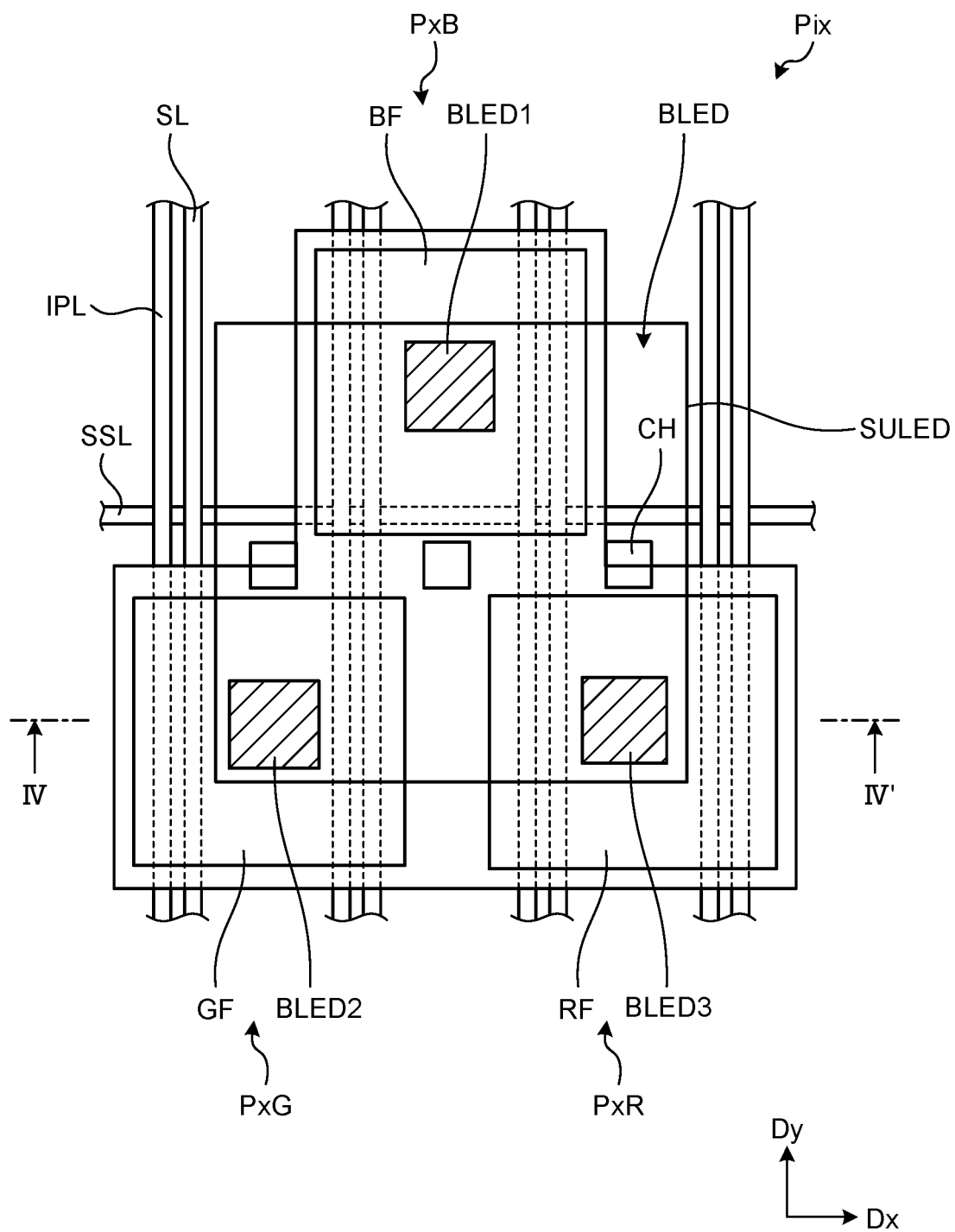
FIG. 2 is a plan view of a plurality of pixels.

FIG. 2 is a plan view of a plurality of pixels. As illustrated in FIG. 2, one pixel Pix includes a first pixel PxB, a second pixel PxG, and a third pixel PxR, for example. The first pixel PxB displays a primary color of blue as the first color. The second pixel PxG displays a primary color of green as the second color. The third pixel PxR displays a primary color of red as the third color. As illustrated in FIG. 2, the second pixel PxG and the third pixel PxR are disposed side by side in the first direction Dx in one pixel Pix. The first pixel PxB and the group of the second pixel PxG and the third pixel PxR are disposed side by side in the second direction Dy. The first color, the second color, and the third color are not limited to blue, green, and red, respectively, and may be any desired colors, such as complementary colors. In the following description, the first pixel PxB, the second pixel PxG, and the third pixel PxR are referred to as pixels Px when they need not be distinguished from one another.

A light emitting element BLED is provided over a plurality of pixels Px. Specifically, the light emitting element BLED includes a light emitting element substrate SULED, a first light emitting part BLED1, a second light emitting part BLED2, and a third light emitting part BLED3. The light emitting element substrate SULED is provided over the first pixel PxB, the second pixel PxG, and the third pixel PxR. The first light emitting part BLED1, the second light emitting part BLED2, and the third light emitting part BLED3 are provided corresponding to the first pixel PxB, the second pixel PxG, and the third pixel PxR, respectively. The first light emitting part BLED1, the second light emitting part BLED2, and the third light emitting part BLED3 output light in the same color, which is blue light, for example. The first light emitting part BLED1, the second light emitting part BLED2, and the third light emitting part BLED3 are separated from one another on the light emitting element substrate SULED and independently output light.

The first pixel PxB includes the first light emitting part BLED1 and a phosphor layer BF. The phosphor layer BF absorbs light output from the first light emitting part BLED1 and outputs blue light resulting from wavelength conversion. The second pixel PxG includes the second light emitting part BLED2 and a phosphor layer GF. The phosphor layer GF absorbs light output from the second light emitting part BLED2 and outputs green light resulting from wavelength conversion. The third pixel PxR includes the third light emitting part BLED3 and a phosphor layer RF. The phosphor layer RF absorbs light output from the third light emitting part BLED3 and outputs red light resulting from wavelength conversion.

The light emitting elements BLED have different luminous efficacy depending on their emission color. All the first light emitting part BLED1, the second light emitting part BLED2, and the third light emitting part BLED3 according to the present embodiment are blue light emitting elements having relatively high luminous efficacy. Consequently, the display device DSP has higher luminous efficacy as a whole than in a case where the red light emitting element is used for the third pixel PxR.

FIG. 2 illustrates video signal lines SL, anode power supply lines IPL, and a pixel control signal line SSL out of various kinds of wiring of a pixel circuit PICA. The video signal lines SL and the anode power supply lines IPL extend in the second direction Dy. A plurality of pairs of the video signal line SL and the anode power supply line IPL are disposed side by side in the first direction Dx. The pixel control signal line SSL extends in the first direction Dx and intersects the video signal lines SL and the anode power supply lines IPL in planar view. A contract hole CH is formed in a grid surrounded by the pairs of the video signal line SL and the anode power supply line IPL and the pixel control signal line SSL. A plurality of contact holes CH are arrayed in the first direction Dx.

In FIG. 2, the first light emitting part BLED1 is disposed on one side in the second direction Dy with respect to the array of the contact holes CH, and the second light emitting part BLED2 and the third light emitting part BLED3 are disposed on the other side in the second direction Dy. In other words, the contact holes CH and the pixel control signal line SSL are provided between the first light emitting part BLED1 and the group of the second light emitting part BLED2 and the third light emitting part BLED3.

The first pixel PxB is provided as a combination of the first light emitting part BLED1 and the phosphor layer BF. The second pixel PxG is provided as a combination of the second light emitting part BLED2 and the phosphor layer GF. The third pixel PxR is provided as a combination of the third light emitting part BLED3 and the phosphor layer RF. The display device DSP displays an image by causing the pixels Px to output different light. The light emitting element BLED is an inorganic light emitting diode (LED) chip having a size of approximately 3 μm to 100 μm in planar view and is called a micro LED. The display device DSP including the micro LEDs in the respective pixels is also called a micro LED display device. The term "micro" of the micro LED is not intended to limit the size of the light emitting element BLED.

The positions of the pixels Px and the first light emitting part BLED1, the second light emitting part BLED2, and the third light emitting part BLED3 are not limited to those illustrated in FIG. 2. The first light emitting part BLED1, the second light emitting part BLED2, and the third light emitting part BLED3 may be disposed side by side in the first direction Dx, for example. Alternatively, the first light emitting part BLED1 and the second light emitting part BLED2 may be disposed side by side in the first direction Dx, and the first light emitting part BLED1 and the third light emitting part BLED3 may be disposed side by side in the second direction Dy. The light emitting element BLED may be provided over four or more pixels Px. In this case, the light emitting element BLED may include four or more light emitting parts.

Figure 3:
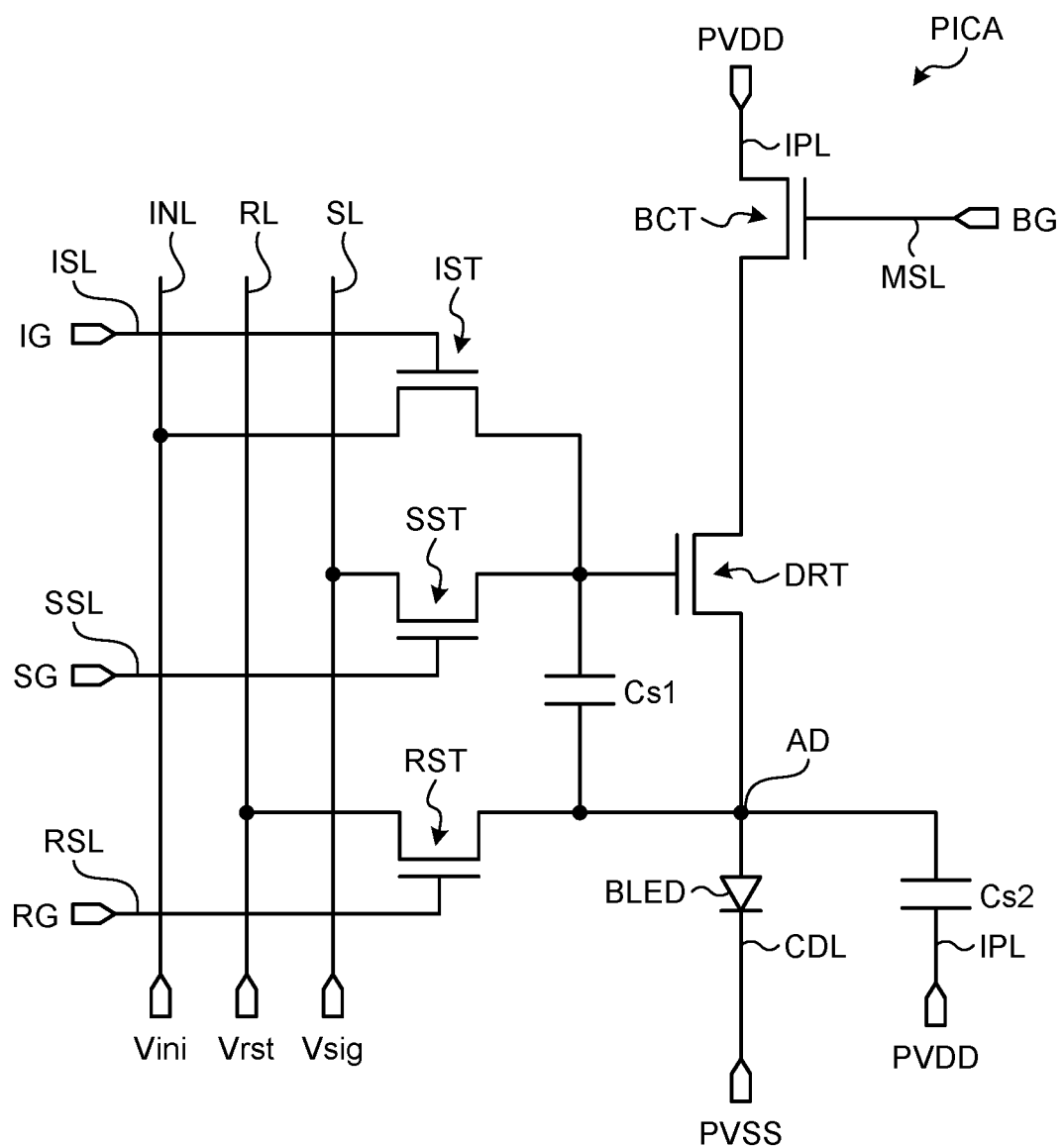
FIG. 3 is a circuit diagram of a pixel circuit.

FIG. 3 is a circuit diagram of a pixel circuit. FIG. 3 illustrates a pixel circuit PICA provided to one pixel Px. The pixel circuit PICA is provided to each of the pixels Px. As illustrated in FIG. 3, the pixel circuit PICA includes the light emitting element BLED, five transistors, and two capacitances. Specifically, the pixel circuit PICA includes a drive transistor DRT, an output transistor BCT, an initialization transistor IST, a pixel selection transistor SST, and a reset transistor RST. The drive transistor DRT, the output transistor BCT, the initialization transistor IST, the pixel selection transistor SST, and the reset transistor RST are n-type thin-film transistors (TFTs). The pixel circuit PICA includes first capacitance Cs1 and second capacitance Cs2. The pixel circuit PICA includes one of the first light emitting part BLED1, the second light emitting part BLED2, and the third light emitting part BLED3 of the light emitting element BLED. To simplify the explanation, the one of the first light emitting part BLED1, the second light emitting part BLED2, and the third light emitting part BLED3 is referred to as the light emitting element BLED in FIG. 3.

The cathode (cathode terminal ELED2 (refer to FIG. 5)) of the light emitting element BLED is coupled to a cathode power supply line CDL. The anode (anode terminal ELED1 (refer to FIG. 5)) of the light emitting element BLED is coupled to an anode power supply line IPL via the drive transistor DRT and the output transistor BCT. The anode power supply line IPL is supplied with an anode power supply potential PVDD. The cathode power supply line CDL is supplied with a cathode power supply potential PVSS. The anode power supply potential PVDD is higher than the cathode power supply potential PVSS.

The anode power supply line IPL supplies the anode power supply potential PVDD serving as a drive potential to the pixel Px. Specifically, the light emitting element BLED emits light by being supplied with a forward current (drive current) by a potential difference (PVDD-PVSS) between the anode power supply potential PVDD and the cathode power supply potential PVSS. In other words, the anode power supply potential PVDD has a potential difference to cause the light emitting element BLED to emit light with respect to the cathode power supply potential PVSS. The anode terminal ELED1 of the light emitting element BLED is coupled to the anode electrode AD. The second capacitance Cs2 serving as an equivalent circuit is coupled between the anode electrode AD and the anode power supply line IPL.

The source electrode of the drive transistor DRT is coupled to the anode terminal ELED1 of the light emitting element BLED via the anode electrode AD, and the drain electrode thereof is coupled to the source electrode of the output transistor BCT. The gate electrode of the drive transistor DRT is coupled to the first capacitance Cs1, the drain electrode of the pixel selection transistor SST, and the drain electrode of the initialization transistor IST.

The gate electrode of the output transistor BCT is coupled to the output control signal line MSL. The output control signal line MSL is supplied with an output control signal BG. The drain electrode of the output transistor BCT is coupled to the anode power supply line IPL.

The source electrode of the initialization transistor IST is coupled to an initialization power supply line INL. The initialization power supply line INL is supplied with an initialization potential Vini. The gate electrode of the initialization transistor IST is coupled to the initialization control signal line ISL. The initialization control signal line ISL is supplied with an initialization control signal IG. In other words, the gate electrode of the drive transistor DRT is coupled to the initialization power supply line INL via the initialization transistor IST.

The source electrode of the pixel selection transistor SST is coupled to a video signal line SL. The video signal line SL is supplied with a video signal Vsig. The gate electrode of the pixel selection transistor SST is coupled to the pixel control signal line SSL. The pixel control signal line SSL is supplied with a pixel control signal SG.

The source electrode of the reset transistor RST is coupled to a reset power supply line RL. The reset power supply line RL is supplied with a reset power supply potential Vrst. The gate electrode of the reset transistor RST is coupled to the reset control signal line RSL. The reset control signal line RSL is supplied with a reset control signal RG. The drain electrode of the reset transistor RST is coupled to the anode terminal ELED1 of the light emitting element BLED and the source electrode of the drive transistor DRT.

The first capacitance Cs1 serving as an equivalent circuit is provided between the drain electrode of the reset transistor RST and the gate electrode of the drive transistor DRT. The pixel circuit PICA can prevent fluctuations in the gate voltage due to parasitic capacitance and current leakage in the drive transistor DRT by the first capacitance Cs1 and the second capacitance Cs2.

The gate electrode of the drive transistor DRT is supplied with an electric potential corresponding to the video signal Vsig (or gradation signal). In other words, the drive transistor DRT supplies an electric current corresponding to the video signal Vsig to the light emitting element BLED based on the anode power supply potential PVDD supplied via the output transistor BCT. As described above, the anode power supply potential PVDD supplied to the anode power supply line IPL is lowered by the drive transistor DRT and the output transistor BCT. As a result, an electric potential lower than the anode power supply potential PVDD is supplied to the anode terminal ELED1 of the light emitting element BLED.

A first electrode of the second capacitance Cs2 is supplied with the anode power supply potential PVDD via the anode power supply line IPL, and a second electrode of the second capacitance Cs2 is supplied with an electric potential lower than the anode power supply potential PVDD. In other words, the first electrode of the second capacitance Cs2 is supplied with an electric potential higher than that supplied to the second electrode of the second capacitance Cs2. The first electrode of the second capacitance Cs2 is the anode power supply line IPL, for example. The second electrode of the second capacitance Cs2 is the anode electrode AD of the drive transistor DRT and an anode coupling electrode coupled to the anode electrode AD, for example.

In the display device DSP, the peripheral circuits GC (illustrated in FIG. 1) select a plurality of pixel rows in order from the first row (e.g., the uppermost pixel row in the display region DA in FIG. 1). The drive IC writes the video signals Vsig (video writing potential) to the pixels Px of the selected pixel row, thereby causing the light emitting elements BLED to emit light. The drive IC supplies the video signals Vsig to the video signal line SL, supplies the reset power supply potential Vrst to the reset power supply line RL, and supplies the initialization potential Vini to the initialization power supply line INL in each horizontal scanning period. The display device DSP repeats these operations in units of an image of one frame.

The configuration of the pixel circuit PICA illustrated in FIG. 3 may be appropriately modified. The number of wires and the number of transistors in one pixel Px may be different from those illustrated in FIG. 3, for example. The pixel circuit PICA may be a current mirror circuit, for example.

Figure 4:
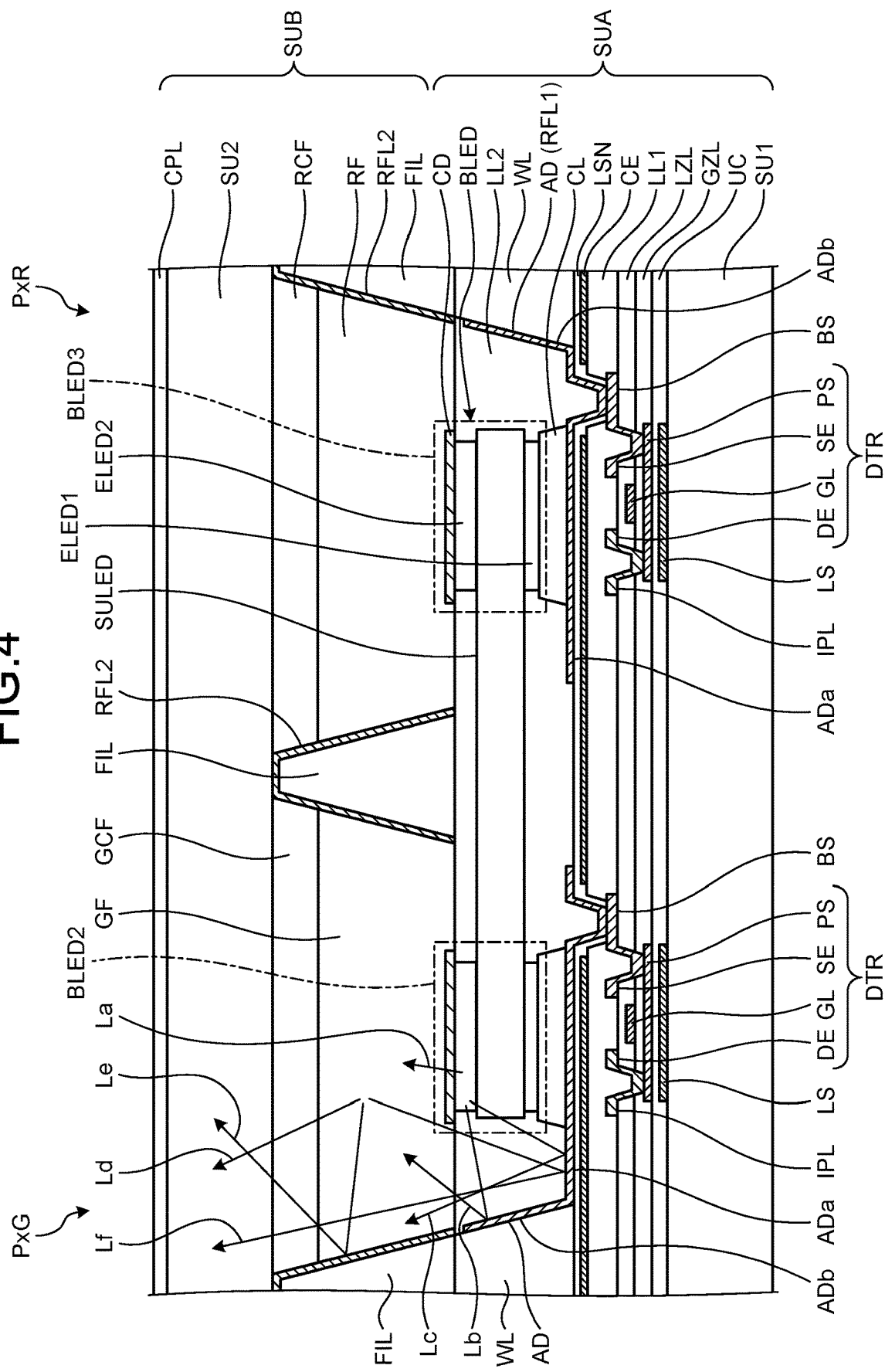
FIG. 4 is a sectional view along line IV-IV' of FIG. 2.
Figure 5:
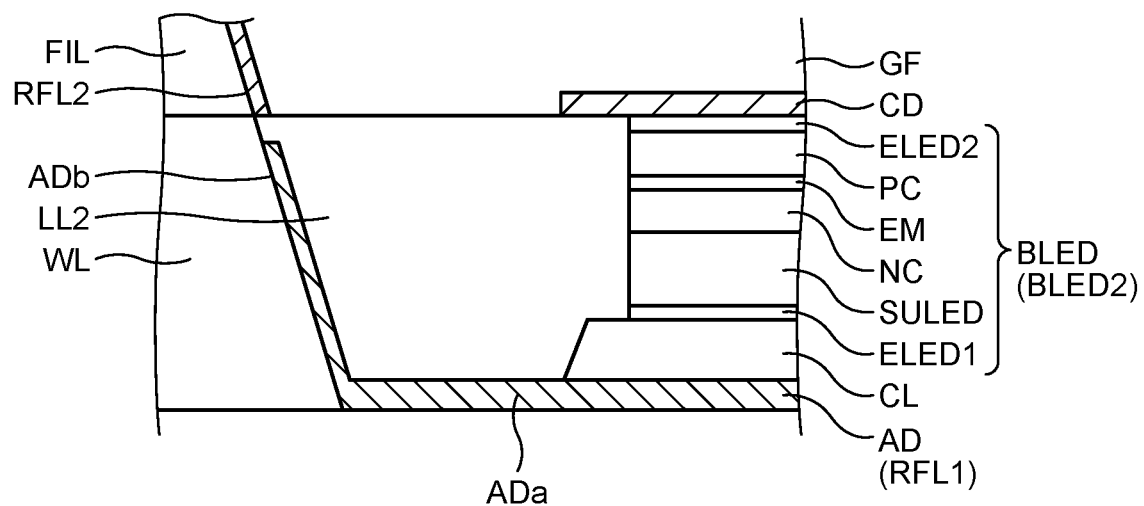
FIG. 5 is an enlarged sectional view of a light emitting element illustrated in FIG. 4.
Figure 6:
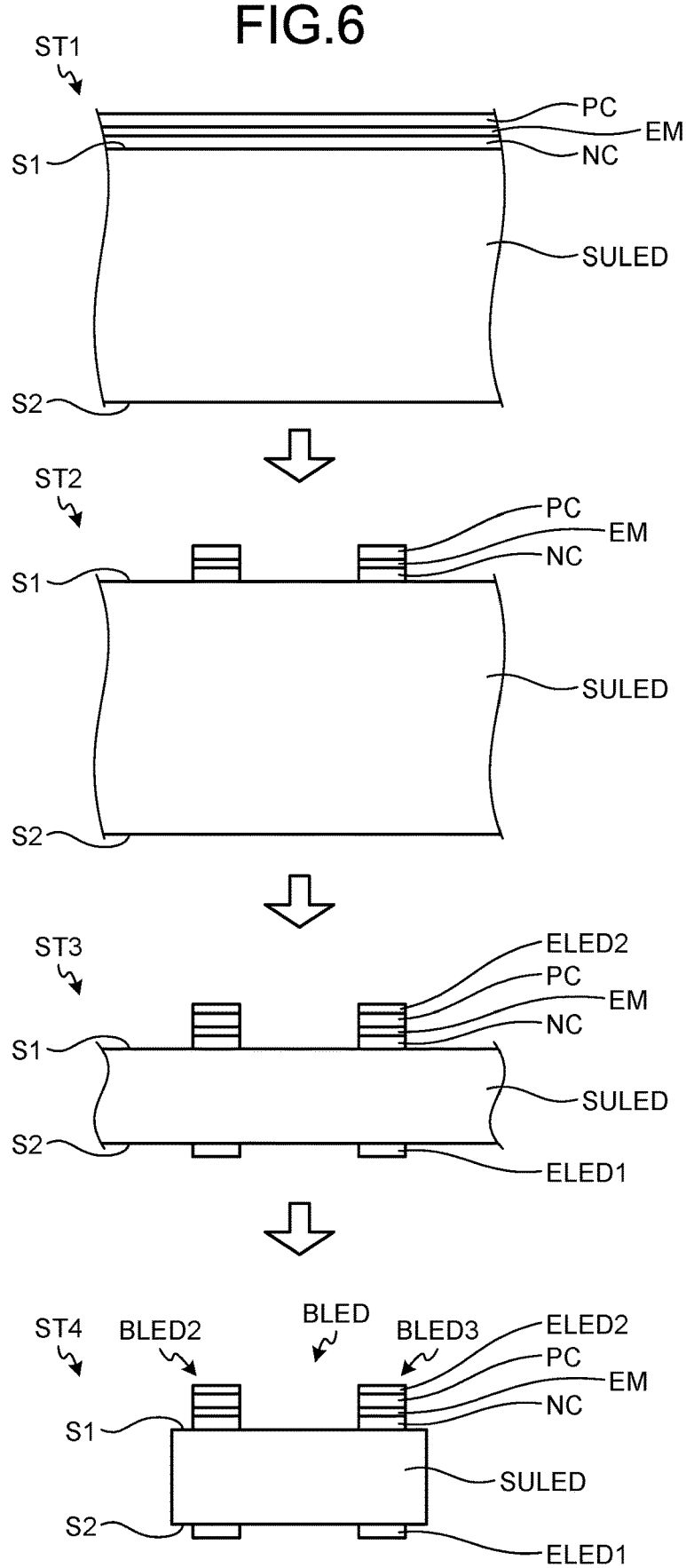
FIG. 6 is a view for explaining a process for manufacturing the light emitting element.

The following describes a specific configuration example of the light emitting element BLED, the phosphor layers BF, GF, and RF, and reflective layers (a first reflective layer RFL1 and a second reflective layer RFL2) with reference to FIGS. 4 to 6. FIG. 4 is a sectional view along line IV-IV' of FIG. 2. FIG. 4 illustrates a sectional structure of the second pixel PxG and the third pixel PxR. The first pixel PxB has the same sectional structure as that of the second pixel PxG and the third pixel PxR. Explanation of the second pixel PxG and the third pixel PxR is also applicable to the first pixel PxB.

As illustrated in FIG. 4, the display device DSP includes the array substrate SUA and a counter substrate SUB. The array substrate SUA includes various layers on a first surface of the first substrate SU1 in order of a light-shielding layer LS, an undercoat layer UC, a semiconductor layer PS, a gate insulating film GZL, scanning wiring GL, an interlayer insulating film LZL, the anode power supply line IPL and a base BS, a first flattening layer LL1, a common electrode CE, a capacitance nitride film LSN, the anode electrode AD and a wall structure WL, a coupling layer CL, the light emitting element BLED and a second flattening layer LL2, and a cathode electrode CD. The first surface of the first substrate SU1 faces the second substrate SU2.

The counter substrate SUB of the second pixel PxG includes a green color filter GCF, the phosphor layer GF, and the second reflective layer RFL2 and a filling layer FIL stacked in order on a first surface of the second substrate SU2. Similarly, the counter substrate SUB of the third pixel PxR includes a red color filter RCF, the phosphor layer RF, and the second reflective layer RFL2 and the filling layer FIL stacked in order on the first surface of the second substrate SU2. The first surface of the second substrate SU2 faces the first substrate SU1. A circularly polarizing plate CPL is provided on a second surface of the second substrate SU2.

The array substrate SUA and the counter substrate SUB face each other and are bonded such that the phosphor layers GF and RF cover the upper surfaces of the second light emitting part BLED2 and the third light emitting part BLED3, respectively, of the light emitting element BLED. The filling layer FIL is formed to fill the gap between the wall structure WL and the second reflective layer RFL2 when the array substrate SUA and the counter substrate SUB are joined. The filling layer FIL is also formed to fill the gap in the second reflective layer RFL2 between the pixels Px disposed side by side.

In the present specification, a direction from the first substrate SU1 to the second substrate SU2 in a direction perpendicular to the surface of the first substrate SU1 is defined as an "upper side". A direction from the second substrate SU2 to the first substrate SU1 is defined as a "lower side".

The light emitting element BLED is provided on the first substrate SU1. The first substrate SU1 is an insulating substrate and is a glass substrate, a resin substrate, or a resin film, for example. The first substrate SU1 is made of borosilicate glass having a thickness of 100 μm, for example.

The drive transistor DTR is provided on a first surface of the first substrate SU1. FIG. 4 illustrates the drive transistor DTR out of the transistors of the pixel circuit PICA. The output transistor BCT, the initialization transistor IST, the pixel selection transistor SST, and the reset transistor RST are also provided on the first surface of the first substrate SU1. Explanation of the multilayered structure of the output transistor BCT, the initialization transistor IST, the pixel selection transistor SST, and the reset transistor RST is omitted herein because they have a configuration similar to that of the drive transistor DTR.

The light-shielding layer LS is a molybdenum tungsten (MoW) alloy film having a layer thickness of approximately 50 nm. The light-shielding layer LS is made of material having lower light transmittance than that of the first substrate SU1 and provided under the semiconductor layer PS. The undercoat layer UC is a multilayered body composed of a silicon nitride (SiN) layer and a silicon oxide (SiO$_2$) layer. The layer thickness of the silicon nitride layer is approximately 100 nm, and that of the silicon oxide layer is approximately 150 nm. The semiconductor layer PS is made of polycrystalline silicon, for example, and is produced by polycrystallizing an amorphous silicon layer by laser annealing. The layer thickness of the semiconductor layer PS is approximately 50 nm, for example.

The gate insulating film GZL is a silicon oxide film having a layer thickness of approximately 100 nm. The scanning wiring GL is a molybdenum tungsten alloy film having a layer thickness of approximately 300 nm. The scanning wiring GL is wiring with which the drain line of the pixel selection transistor SST and the drain line of the initialization transistor IST merge. The gate insulating film GZL is provided between the semiconductor layer PS and the scanning wiring GL in the normal direction of the first substrate SU1. The interlayer insulating film LZL is a multilayered body composed of a silicon oxide layer and a silicon nitride layer. The layer thickness of the silicon oxide layer is approximately 350 nm, and that of the silicon nitride layer is approximately 375 nm.

The anode power supply line IPL and the base BS are provided in the same layer and are three-layer films composed of titanium (Ti), aluminum (Al), and titanium (Ti). The layer thicknesses of the respective layers are approximately 100 nm, 400 nm, and 200 nm. The part of the anode power supply line IPL overlapping the semiconductor layer PS functions as a drain electrode DE of the drive transistor DTR. The part of the base BS overlapping the semiconductor layer PS functions as a source electrode SE of the drive transistor DTR. The drain electrode DE and the source electrode SE are each coupled to the semiconductor layer PS through a contact hole formed in the interlayer insulating film LZL and the gate insulating film GZL.

The first flattening layer LL1 and the second flattening layer LL2 are organic insulating films. The layer thickness of the first flattening layer LL1 is approximately 2 µm, and the layer thickness of the second flattening layer LL2 is approximately 10 µm. The common electrode CE and the cathode electrode CD are made of indium tin oxide (ITO). The layer thickness of the common electrode CE is approximately 50 nm and that of the cathode electrode CD is approximately 100 nm. The capacitance nitride film LSN is a silicon nitride layer produced by low-temperature deposition and has a layer thickness of approximately 120 nm. The capacitance nitride film LSN is provided between the common electrode CE and the anode electrode AD in the normal direction of the first substrate SU1.

The wall structure WL faces the side surfaces of the light emitting element BLED. The wall structure WL is provided on the capacitance nitride film LSN in a manner surrounding the light emitting element BLED. The anode electrode AD, the coupling layer CL, the light emitting element BLED, and the second flattening layer LL2 are provided in the recess formed by the wall structure WL and the capacitance nitride film LSN. Examples of the material of the wall structure WL include, but are not limited to, a positive photoresist composed of novolac resin and naphthoquinone serving as photosensitive material, a negative resist composed of acrylic resin, etc. Alternatively, the wall structure WL may be formed by forming a negative resist and then covering the side surfaces of the negative resist with a positive photoresist.

The anode electrode AD is a multilayered body composed of ITO, silver (Ag), and ITO. The anode electrode AD is provided on the capacitance nitride film LSN and coupled to the base BS through a contact hole formed in the first flattening layer LL1. The anode electrode AD is provided to each pixel Px and electrically coupled to each of the light emitting parts. The anode electrode AD of the second pixel PxG is separated from the anode electrode AD of the third pixel PxR.

The anode electrode AD includes an anode electrode bottom part ADa and an anode electrode inclining part ADb. The anode electrode bottom part ADa is provided on the capacitance nitride film LSN over a region overlapping the light emitting element BLED and a region not overlapping the light emitting element BLED. The anode electrode inclining part ADb is coupled to the end of the anode electrode bottom part ADa and provided inclining along the inner wall surface of the wall structure WL. The anode electrode inclining part ADb faces the side surface of the light emitting element BLED with the second flattening layer LL2 interposed therebetween. In other words, the anode electrode AD extends from the inside to the outside of the light emitting element BLED and is provided around the light emitting element BLED in planar view.

The light emitting element BLED is disposed between the anode electrode inclining part ADb of the second pixel PxG and the anode electrode inclining part ADb of the third pixel PxR in a direction parallel to the first substrate SU1. The anode electrode AD is made of metal material that reflects light and also functions as the first reflective layer RFL1 that reflects light output from the light emitting element BLED.

The coupling layer CL is made of silver paste and provided on the anode electrode AD between the first substrate SU1 and the light emitting element BLED. The second light emitting part BLED2 and the third light emitting part BLED3 of the light emitting element BLED are each provided on and electrically coupled to the coupling layer CL. In other words, the second light emitting part BLED2 and the third light emitting part BLED3 of the light emitting element BLED are each electrically coupled to the anode electrode AD via the coupling layer CL.

The second flattening layer LL2 covers the side surfaces of the light emitting element BLED and is provided in the recess formed by the wall structure WL and the anode electrodes AD. The second flattening layer LL2 is also provided on the upper surface and the lower surface of the light emitting element substrate SULED between the second light emitting part BLED2 and the third light emitting part BLED3 of the light emitting element BLED. The upper surface of the second flattening layer LL2 matches the upper surface of the wall structure WL.

Similarly to the first substrate SU1, the second substrate SU2 in the counter substrate SUB is made of borosilicate glass having a thickness of 100 µm, for example.

In the second pixel PxG, the green color filter GCF is provided on the phosphor layer GF, that is, between the phosphor layer GF and the second substrate SU2 in the normal direction of the first substrate SU1. In the third pixel PxR, the red color filter RCF is provided on the phosphor layer RF, that is, between the phosphor layer RF and the second substrate SU2 in the normal direction of the first substrate SU1. In the first pixel PxB, which is not illustrated in FIG. 4, the phosphor layer BF and the blue color filter BCF are provided on the first light emitting part BLED1.

In the following description, the blue color filter BCF, the green color filter GCF, and the red color filter RCF are referred to as color filters CF when they need not be distinguished from one another.

The blue color filter BCF, the green color filter GCF, and the red color filter RCF are formed by patterning a negative resist containing blue, green, and red pigments, respectively. The layer thickness of the blue color filter BCF, the green color filter GCF, and the red color filter RCF is approximately 2 µm, for example. The blue color filter BCF, the green color filter GCF, and the red color filter RCF can absorb light having a blue wavelength component output from the light emitting element BLED and increase the color purity of light output to the second substrate SU2. In addition, the color filters CF absorb the components that excite the phosphor layers BF, GF, and RF in light incident from the outside. As a result, the color filters CF can prevent the phosphor layers BF, GF, and RF from emitting light by external light.

The phosphor layer GF is provided overlapping the green color filter GCF. The side surfaces of the phosphor layer GF and the green color filter GCF incline with respect to the normal direction (third direction Dz) of the substrate. The area of the lower surface of the phosphor layer GF is smaller than that of the upper surface of the green color filter GCF. Similarly, the phosphor layer RF is provided overlapping the red color filter RCF. The side surfaces of the phosphor layer RF and the red color filter RCF incline with respect to the normal direction (third direction Dz) of the substrate. The area of the lower surface of the phosphor layer RF is smaller than that of the upper surface of the red color filter RCF. The phosphor layer GF and the green color filter GCF are provided in a region overlapping the anode electrode AD in planar view. Similarly, the phosphor layer RF and the red color filter RCF are provided in a region overlapping the anode electrode AD in planar view.

The phosphor layer RF, the phosphor layer GF, and the phosphor layer BF (not illustrated in FIG. 4) are formed by patterning a negative resist containing quantum dots that emit red, green, and blue light, respectively. The layer thickness of the phosphor layers RF and GF is approximately 30 μm, for example. The quantum dot is composed of a cadmium selenide (CdSe) core structure and a zinc sulfide (ZnS) shell structure surrounding the CdSe core structure. The particle size of the quantum dot that emit red, green, and blue light is adjusted to have the fluorescent maximum wavelength at wavelengths of 630 nm, 530 nm, and 460 nm, respectively. The quantum dot has a continuous absorption spectrum and performs sufficient absorption at the maximum emission wavelength of the light emitting element BLED. The shell structure has an organic molecular chain on the surface to increase the compatibility with the negative resist.

The present embodiment is not limited thereto, and a non-cadmium-based quantum dot may be used. Examples of the non-cadmium-based quantum dot include, but are not limited to, a quantum dot composed of an indium phosphide (InP) core structure and a zinc sulfide (ZnS) shell structure, etc.

The second reflective layer RFL2 is made of metal material, such as aluminum (Al). The layer thickness of the second reflective layer RFL2 is approximately 100 nm, for example. The second reflective layer RFL2 is provided over the side surfaces of the phosphor layer GF and the green color filter GCF and the side surfaces of the phosphor layer RF and the red color filter RCF.

The filling layer FIL is an organic insulating film and is provided around the second reflective layer RFL2, the phosphor layer GF and the green color filter GCF, and the phosphor layer RF and the red color filter RCF. In other words, the filling layer FIL is provided between the second pixel PxG and the third pixel PxR.

The array substrate SUA and the counter substrate SUB are bonded such that the phosphor layers GF and RF overlap the second flattening layer LL2 and that the filling layer FIL overlaps the wall structure WL. As a result, the phosphor layer GF is provided covering the upper surface of the second light emitting part BLED2 and the second flattening layer LL2. The phosphor layer RF is provided covering the upper surface of the third light emitting part BLED3 and the second flattening layer LL2.

The second reflective layers RFL2 provided outside the second pixel PxG and the third pixel PxR are disposed farther away from the first substrate SU1 than the first reflective layer RFL1 (anode electrode AD) in the normal direction of the first substrate SU1. The anode electrode inclining part ADb and the second reflective layer RFL2 incline with respect to the normal direction of the first substrate SU1. The second flattening layer LL2 serving as an insulating layer is provided between the lower end of the second reflective layer RFL2 and the upper end of the anode electrode inclining part ADb. In the sectional shape, the second reflective layer RFL2 is disposed on the same line with the anode electrode inclining part ADb of the anode electrode AD. The present embodiment is not limited thereto, and the second reflective layer RFL2 is not necessarily aligned with the anode electrode inclining part ADb of the anode electrode AD.

The second reflective layers RFL2 provided between the second pixel PxG and the third pixel PxR are disposed overlapping the light emitting element BLED in planar view. The lower end of the second reflective layer RFL2 of the second pixel PxG has an opening. The lower end of the second reflective layer RFL2 of the third pixel PxR has an opening. The openings of the second reflective layers RFL2 overlap the opening at the upper end of the anode electrode AD in planar view.

The material and the layer thickness of the layers are given by way of example only and may be appropriately modified. The semiconductor layer PS, for example, is not necessarily made of polycrystalline silicon and may be made of amorphous silicon, microcrystalline oxide semiconductor, amorphous oxide semiconductor, low-temperature polycrystalline silicon (LTPS), or gallium nitride (GaN). Examples of the oxide semiconductor include, but are not limited to, IGZO, zinc oxide (ZnO), ITZO, etc. IGZO is indium gallium zinc oxide, and ITZO is indium tin zinc oxide. In the example illustrated in FIG. 4, the drive transistor DTR has what is called a top-gate structure. The drive transistor DTR may have a bottom-gate structure in which the gate electrode is provided under the semiconductor layer PS. Alternatively, the drive transistor DTR may have a dual-gate structure in which the gate electrodes are provided both on and under the semiconductor layer PS.

The following describes the configuration of the light emitting element BLED. FIG. 5 is an enlarged sectional view of the light emitting element illustrated in FIG. 4. While FIG. 5 illustrates a sectional structure of the second light emitting part BLED2, the first light emitting part BLED1 and the third light emitting part BLED3 also have the same multilayered structure. As illustrated in FIG. 5, the second light emitting part BLED2 includes a light emitting element substrate SULED, an n-type cladding layer NC, a light emitting layer EM, a p-type cladding layer PC, the anode terminal ELED1, and the cathode terminal ELED2. The n-type cladding layer NC, the light emitting layer EM, the p-type cladding layer PC, and the cathode terminal ELED2 are stacked in order on the light emitting element substrate SULED. The anode terminal ELED1 is provided between the light emitting element substrate SULED and the coupling layer CL.

In the second light emitting part BLED2 that outputs blue light, the light emitting layer EM is made of indium gallium nitride (InGaN). The composition ratio of indium to gallium is 0.2:0.8, for example. The p-type cladding layer PC and the n-type cladding layer NC are made of gallium nitride (GaN). The light emitting element substrate SULED is made of silicon carbide (SiC). Both the anode terminal ELED1 and the cathode terminal ELED2 are made of aluminum. The maximum emission wavelength of the second light emitting part BLED2 is 450 nm.

The light emitting element BLED includes a plurality of light emitting parts (the first light emitting part BLED1, the second light emitting part BLED2, and the third light emitting part BLED3) separated from one another on the single light emitting element substrate SULED (refer to FIG. 2). In other words, the n-type cladding layers NC, the light emitting layers EM, and the p-type cladding layers PC of the respective light emitting parts are separated from one another. This configuration can prevent light output from the first light emitting part BLED1, for example, from propagating in the light emitting element BLED and being output near the other light emitting parts.

The following describes the method for manufacturing the light emitting element BLED. FIG. 6 is a view for explaining the process for manufacturing the light emitting element. As illustrated in FIG. 6, the manufacturing apparatus forms the n-type cladding layer NC, the light emitting layer EM, and the p-type cladding layer PC in order on a first surface S1 of the light emitting element substrate SULED (Step ST1).

Subsequently, the manufacturing apparatus patterns the n-type cladding layer NC, the light emitting layer EM, and the p-type cladding layer PC by dry etching (Step ST2). As a result, a plurality of multilayered bodies each composed of the n-type cladding layer NC, the light emitting layer EM, and the p-type cladding layer PC are formed like islands separated from one another on the first surface S1 of the light emitting element substrate SULED.

Subsequently, the manufacturing apparatus reduces the thickness of the light emitting element substrate SULED on a second surface S2 and forms the anode terminal ELED1 on the bottom surface of the second surface S2 of the light emitting element substrate SULED (Step ST3). The manufacturing apparatus then cuts the light emitting element substrate SULED into a rectangular shape (Step ST4). As described above, the manufacturing apparatus manufactures the light emitting element BLED including a plurality of light emitting parts.

The n-type cladding layer NC, the light emitting layer EM, and the p-type cladding layer PC are patterned by dry etching. This manufacturing method can reduce damage to the layers compared with cutting with a dicing saw or the like. In addition, the n-type cladding layer NC, the light emitting layer EM, and the p-type cladding layer PC are sufficiently separated from the cut surfaces of the light emitting element substrate SULED. This structure can reduce damage to the n-type cladding layer NC, the light emitting layer EM, and the p-type cladding layer PC caused in processing the light emitting element substrate SULED. Consequently, the light emitting parts of the light emitting element BLED prevent electrons and holes from being quenched by structural defects and have higher internal quantum efficiency.

The manufacturing apparatus disposed the light emitting element BLED on the coupling layer CL illustrated in FIG. 4. When the light emitting element BLED is disposed to the coupling layer CL made of silver paste, the coupling layer CL deforms depending on force, and thereby adheres and is electrically coupled to the light emitting element BLED. Alternatively, the coupling layer CL may be made of the same metal material, such as aluminum, as that of the anode terminal ELED1. In this case, the manufacturing apparatus disposes the light emitting element BLED on the coupling layer CL and then performs heating, thereby integrating the anode terminal ELED1 and the coupling layer CL. As a result, the coupling layer CL is satisfactorily electrically coupled to the light emitting element BLED. The cathode electrode CD is provided on the upper surface of the light emitting element BLED and between the light emitting element BLED and the phosphor RF.

Figure 7:
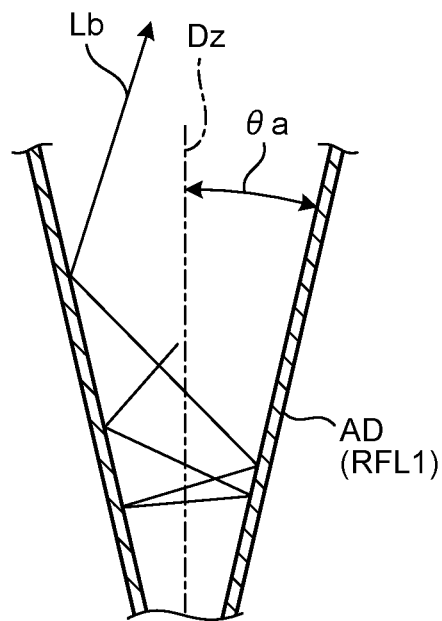
FIG. 7 is a view for explaining a traveling direction of light reflected by an anode electrode.
Figure 8:
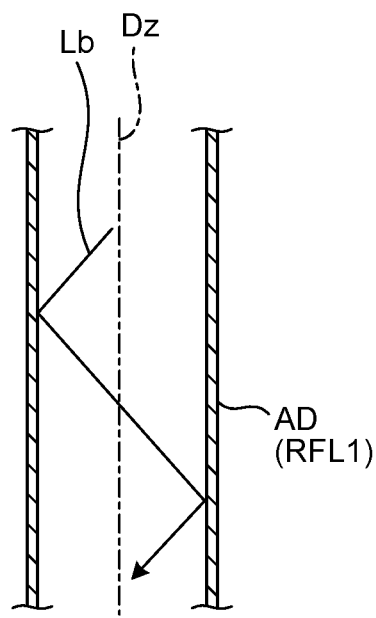
FIG. 8 is a view for explaining another example of the traveling direction of light reflected by the anode electrode.

The following describes an optical path and wavelength conversion of light output from the second light emitting part BLED2 with reference to FIGS. 4, 7, and 8. Explanation of the optical path and the wavelength conversion of light output from the second light emitting part BLED2 is also applicable to the third light emitting part BLED3 and the first light emitting part BLED1.

FIG. 4 illustrates light La output upward and light Lb and Lc output sideward in the light output from the second light emitting part BLED2. The light La is output from the upper surface of the second light emitting part BLED2, passes through the cathode electrode CD, and is incident on the phosphor layer GF. The light Lb is output from the side surface of the second light emitting part BLED2, passes through the second flattening layer LL2, and is incident on the anode electrode inclining part ADb. The light Lb reflected by the anode electrode inclining part ADb is incident on the phosphor layer GF because the anode electrode inclining part ADb inclines. The light Lc is output toward the lower side (toward the first substrate SU1) than the light Lb. The light Lc passes through the second flattening layer LL2 and is incident on the anode electrode bottom part ADa. The light Lc reflected by the anode electrode bottom part ADa is incident on the phosphor layer GF.

As described above, the anode electrode AD (first reflective layer RFL1) causes the light Lb and Lc output sideward from the second light emitting part BLED2 to be incident on the phosphor layer GF. The light La is incident on the phosphor layer GF without being reflected by the anode electrode AD. The light La, Lb, and Lc incident on the gap between the anode electrode inclining part ADb and the second reflective layer RFL2 becomes leaking light. The amount of leaking light accounts for a slight part of the whole amount of light, and most of the light La, Lb, and Lc is incident on the phosphor layer GF.

The phosphor layer GF receives the light La, Lb, and Lc, thereby emitting green light. The phosphor layer GF isotropically emits light. FIG. 4 illustrates fluorescence Ld, Le, and Lf in the light generated in the phosphor layer GF. The fluorescence Ld emitted upward is not incident on the second reflective layer RFL2 and is output to the second substrate SU2 through the color filter GCF. The fluorescence Le emitted sideward is incident on the second reflective layer RFL2. The fluorescence Le reflected by the second reflective layer RFL2 is output to the second substrate SU2 through the color filter GCF because the second reflective layer RFL2 inclines. The fluorescence Lf emitted downward is incident on the anode electrode AD. The fluorescence Lf reflected by the anode electrode AD is output to the second substrate SU2 through the phosphor layer GF again.

As described above, the second reflective layer RFL2 is provided facing the side surfaces of the phosphor layer GF, and the anode electrode AD is provided under the phosphor layer GF. The second reflective layer RFL2 extends to the upper side than the upper surface of the phosphor layer RF, and the anode electrode AD extends to the lower side than the lower surface of the phosphor layer RF. This configuration can increase the number of times of reflection of the light La, Lb, and Lc and the fluorescence Ld, Le, and Lf compared with the case where a reflective layer is provided only to the side surfaces of the phosphor layer RF. The fluorescence Ld, Le, and Lf is reflected a plurality of times on the anode electrode AD and the second reflective layer RFL2, thereby changing its traveling direction. In other words, the traveling direction of the fluorescence Ld, Le, and Lf isotropically emitted in the phosphor layer RF is converted to a direction closer to the normal direction of the first substrate SU1 by the anode electrode AD and the second reflective layer RFL2. The fluorescence Ld, Le, and Lf is then output to the second substrate SU2. Consequently, the display device DSP has higher light extraction efficiency.

Similarly, light output from the third light emitting part BLED3 is absorbed by the phosphor layer RF, converted into red light, and output to the second substrate SU2 through the color filter RCF. Similarly, light output from the first light emitting part BLED1, which is not illustrated in FIG. 4, is absorbed by the phosphor layer BF, converted into blue light, and output to the second substrate SU2 through the color filter BCF.

The difference in the maximum wavelength between the phosphor layer BF and the first light emitting part BLED1 is approximately 20 nm, and the phosphor layer BF has a small wavelength conversion effect. In the first light emitting part BLED1, conversion of the emission angular distribution is more important than the wavelength conversion. In other words, light output from the first light emitting part BLED1 is absorbed and caused to emit light by the phosphor layer BF and reflected by the anode electrode AD and the second reflective layer RFL2. As a result, blue light output from the first pixel PxB has the same angular distribution as that of green light output from the second pixel PxG and red light output from the third pixel PxR. Consequently, the display device DSP can provide uniform chromaticity independently of the observation direction.

The filling layer FIL and the second reflective layer RFL2 are also provided between the second pixel PxG and the third pixel PxR disposed side by side. Specifically, the filling layer FIL and the second reflective layer RFL2 are provided between the group of the phosphor layer GF and the color filter GCF and the group of the phosphor layer RF and the color filter RCF. Consequently, the display device DSP can prevent color mixture of light generated in the phosphor layer GF and light generated in the phosphor layer RF.

FIG. 7 is a view for explaining a traveling direction of light reflected by the anode electrode. FIG. 8 is a view for explaining another example of a traveling direction of light reflected by the anode electrode. While FIGS. 7 and 8 illustrate reflection on the anode electrode AD, explanation with reference to FIGS. 7 and 8 is also applicable to the second reflective layer RFL2.

In FIG. 7, the angle formed by the anode electrode AD and the third direction Dz is θa. In FIG. 8, the angle formed by the anode electrode AD and the third direction Dz is 0°, that is, the anode electrode AD is provided along the normal direction of the first substrate SU1. If the length of the anode electrode AD is sufficiently long, the traveling direction of the light Lb is distributed within a range of an angle of 2θa, that is, a range of ±θa about the third reaction Dz.

As illustrated in FIG. 7, the traveling direction of the light Lb is changed every time the light Lb is reflected by the anode electrode AD. If the light Lb is output toward lower left, the traveling direction of the light Lb is changed to upward by being reflected twice by the anode electrode AD. The light Lb is output upward by being reflected five times. The light Lb is output toward the phosphor layer GF (refer to FIG. 4).

In FIG. 8, the traveling direction of the light Lb is not changed to upward, and the light Lb is output downward, that is, toward the first substrate SU1 without any change. The light Lb traveling toward the first substrate SU1 is reflected by the anode electrode bottom part ADa. As a result, the traveling direction is changed to upward, and the light Lb is output toward the second substrate SU2.

When the angle formed by the anode electrode AD and the third direction Dz is θ, the traveling direction of the light Lb comes closer to the third direction Dz by 2θ every time the light Lb is reflected by the anode electrode AD. In other words, the light Lb traveling within a range from 0° to θ with respect to the third direction Dz is output toward the phosphor layer GF without being reflected at all. The light Lb traveling within an angular range from θ to an angle smaller than 3θ with respect to the third direction Dz is output toward the phosphor layer GF by being reflected once. The light Lb traveling within an angular range from 3θ to an angle smaller than 5θ with respect to the third direction Dz is output toward the phosphor layer GF by being reflected twice. Similarly, light traveling at an angle of 5θ or larger is output toward the phosphor layer GF by being reflected a larger number of times.

Similarly to this, the fluorescence Ld, Le, and Lf emitted in the phosphor layer GF is output toward the second substrate SU2 by being reflected by the second reflective layer RFL2 a plurality of number of times.

As described above, a pair of anode electrodes AD preferably incline in opposite directions. Specifically, the angle θ preferably falls within a range of 10° to 40°. Similarly, a pair of second reflective layers RFL2 preferably incline in opposite directions. Specifically, the angle θ preferably falls within a range of 10° to 40°.

In the display DSP according to the present embodiment, one light emitting element BLED includes a plurality of light emitting parts (the first light emitting part BLED1, the second light emitting part BLED2, and the third light emitting part BLED3) that can be independently controlled. The light emitting parts are each provided with one light extraction structure, and one light emitting element BLED serves as a plurality of pixels Px. The light extraction structures each include the phosphor layer BF, GF, or RF, the reflective layers (the anode electrode AD and the second reflective layer RFL2), and the color filter BCF, GCF, or RCF. The phosphor layers BF, GF, and RF convert the wavelength of light output from the light emitting element BLED. The reflective layers (the anode electrode AD and the second reflective layer RFL2) cause fluorescence to travel forward. The color filters BCF, GCF, and RCF absorb light output from the light emitting element BLED and excitation light components in external light. With this configuration, the display device DSP can increase the light extraction efficiency of the light emitting element BLED. In addition, one light emitting element BLED serves as a plurality of pixels Px. This configuration requires a smaller number of light emitting elements BLED than in a case where the light emitting elements BLED are provided to the respective pixels Px and enables the same light emitting elements BLED to be arrayed. Consequently, the light emitting elements BLED can be arrayed in a simpler manner.

First Modification of the First Embodiment

Figure 9:
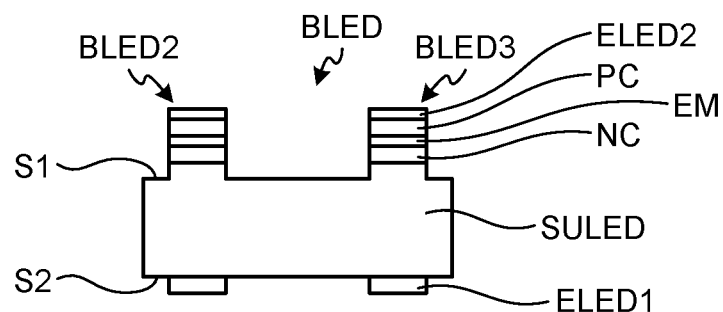
FIG. 9 is a sectional view of the light emitting element according to a first modification of the first embodiment.

FIG. 9 is a sectional view of the light emitting element according to a first modification of the first embodiment. As illustrated in FIG. 9, the first surface S1 of the light emitting element substrate SULED has a recess between a plurality of multilayered bodies each composed of the n-type cladding layer NC, the light emitting layer EM, and the p-type cladding layer PC. The distance between the first surface S1 and the second surface S2 at the part provided with the multilayered bodies is larger than that between the first surface S1 and the second surface S2 at the part not provided with the multilayered bodies.

The light emitting element substrate SULED, for example, is patterned between the second light emitting part BLED2 and the third light emitting part BLED3. As a result, the path connecting the lower part of the second light emitting part BLED2 and the lower part of the third light emitting part BLED3 is made longer in the light emitting element substrate SULED. This configuration can prevent light output from the second light emitting part BLED2 and the third light emitting part BLED3 from propagating in the light emitting element BLED and being output near the other light emitting parts.

The light emitting element substrate SULED can be patterned simultaneously with the process of pattering the n-type cladding layer NC, the light emitting layer EM, and the p-type cladding layer PC by dry etching performed at Step ST2 in FIG. 6. The light emitting element substrate SULED may be patterned in a process different from the process at Step ST2 in FIG. 6.

Second Modification of the First Embodiment

Figure 10:
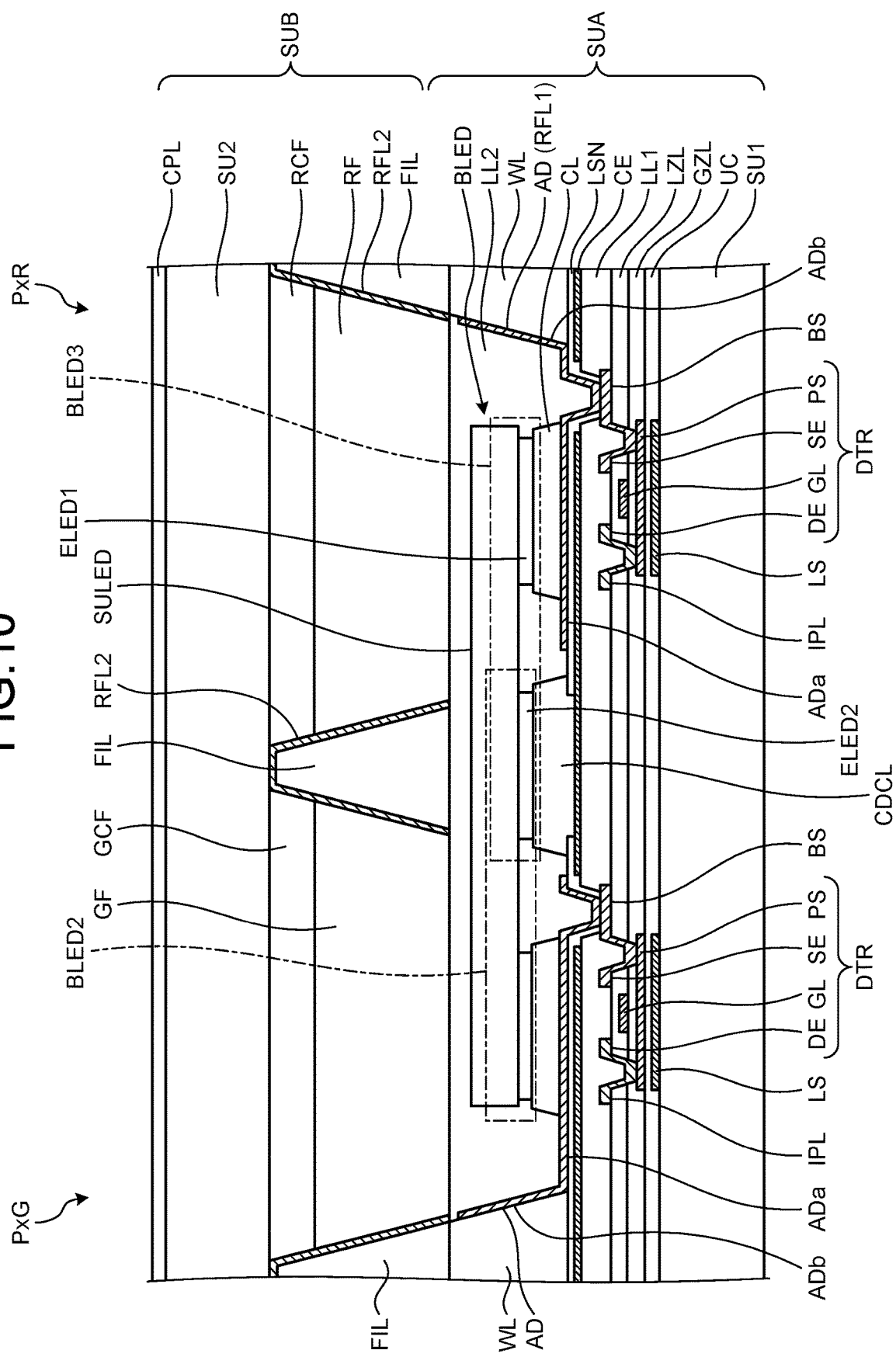
FIG. 10 is a sectional view of the display device according to a second modification of the first embodiment.
Figure 11:
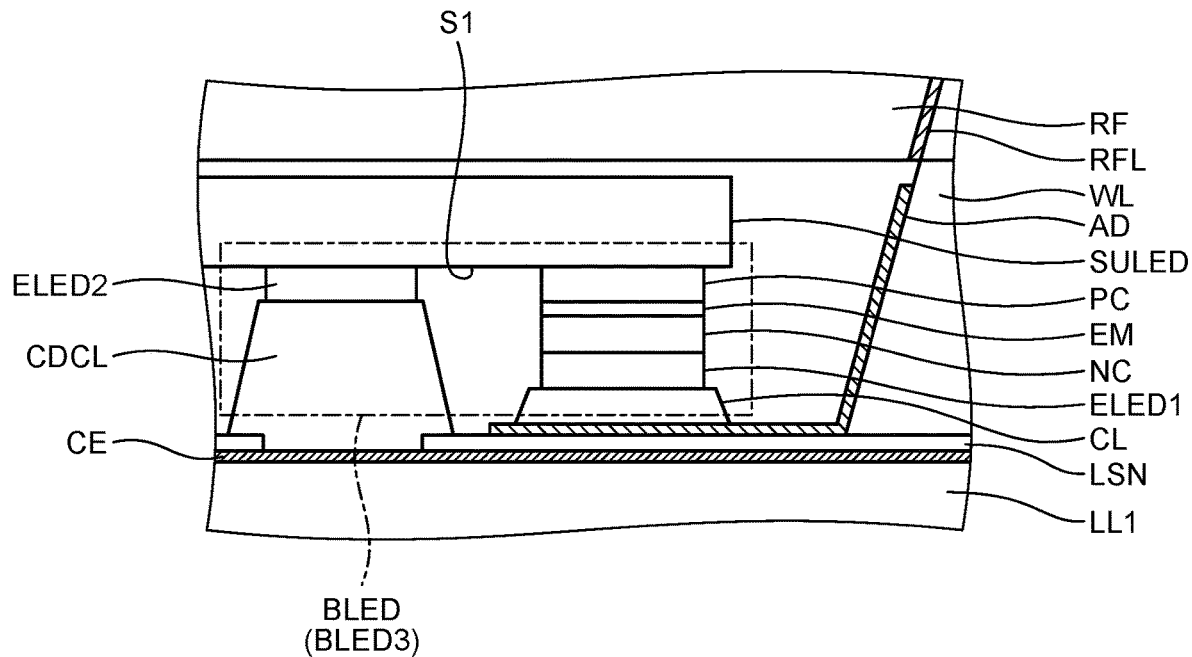
FIG. 11 is an enlarged sectional view of the light emitting element illustrated in FIG. 10.

FIG. 10 is a sectional view of the display device according to a second modification of the first embodiment. FIG. 11 is an enlarged sectional view of the light emitting element illustrated in FIG. 10. While the light emitting element BLED according to the first embodiment and the first modification has a vertical structure in which the light emitting element BLED is coupled to the anode electrode AD at the lower part and to the cathode electrode CD at the upper part, the structure of the light emitting element BLED is not limited thereto. As illustrated in FIG. 10, both the anode electrode AD and the cathode electrode CD (common electrode CE) according to the second modification are provided on the first substrate SU1.

In the light emitting element BLED, both the anode terminal ELED1 and the cathode terminal ELED2 are provided on the surface of the light emitting element substrate SULED facing the first substrate SU1. The anode terminals ELED1 are each provided to the first light emitting part BLED1 (not illustrated in FIG. 10), the second light emitting part BLED2, or the third light emitting part BLED3 and coupled to the anode electrode AD via the coupling layer CL.

The cathode terminal ELED2 is provided as one terminal common to the first light emitting part BLED1 (not illustrated in FIG. 10), the second light emitting part BLED2, and the third light emitting part BLED3 and coupled to the common electrode CE via a cathode coupling layer CDCL.

FIG. 11 illustrates the multilayered structure of the third light emitting part BLED3. As illustrated in FIG. 11, the p-type cladding layer PC, the light emitting layer EM, the n-type cladding layer NC, and the anode terminal ELED1 are stacked in order on the first surface S1 of the light emitting element substrate SULED. The first surface S1 faces the first substrate SU1. The cathode terminal ELED2 and the cathode coupling layer CDCL are stacked in order on the first surface S1 of the light emitting element substrate SULED. The cathode coupling layer CDCL is electrically coupled to the common electrode CE through an opening formed in the capacitance nitride film LSN.

As described above, the light emitting element BLED may have a horizontal structure in which the anode terminal ELED1 and the cathode terminal ELED2 are disposed on the same surface. While the third light emitting part BLED3 is illustrated in FIG. 11, the first light emitting part BLED1 and the second light emitting part BLED2 may also have the same configuration.

Figure 12:
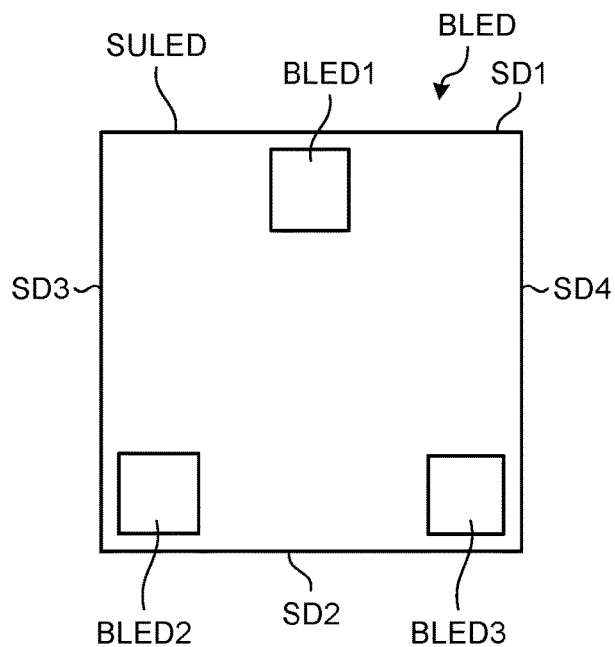
FIG. 12 is a plan view of the light emitting element according to the first embodiment.

The following describes various modifications of the configuration of the light emitting element BLED in planar view. FIG. 12 is a plan view of the light emitting element according to the first embodiment. In the light emitting element BLED illustrated in FIG. 12, the light emitting element substrate SULED has a square planar shape. The first light emitting part BLED1 is provided near the center of a first side SD1 of the light emitting element substrate SULED. The second light emitting part BLED2 is provided near the corner formed by a second side SD2 and a third side SD3 of the light emitting element substrate SULED. The third light emitting part BLED3 is provided near the corner formed by the second side SD2 and a fourth side SD4 of the light emitting element substrate SULED. The light emitting element substrate SULED of the light emitting element BLED illustrated in FIG. 12 can be cut in a simpler manner.

Third Modification of the First Embodiment

Figure 13:
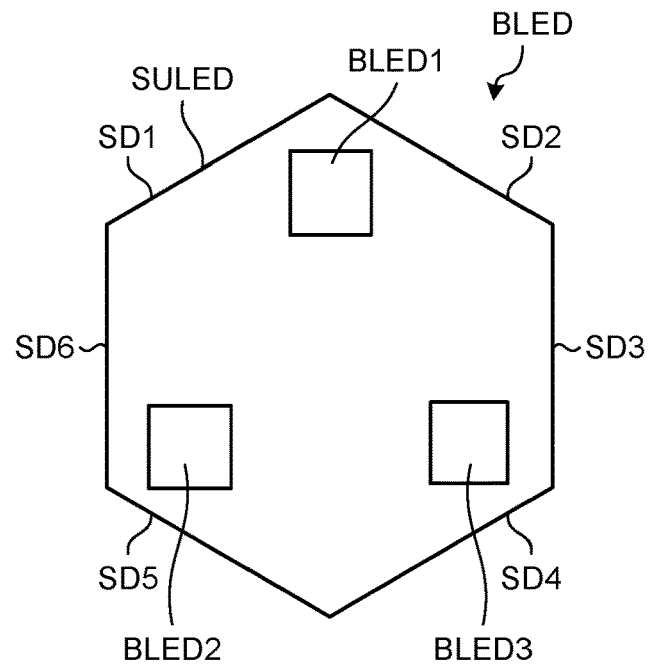
FIG. 13 is a plan view of the light emitting element according to a third modification of the first embodiment.

FIG. 13 is a plan view of the light emitting element according to a third modification of the first embodiment. In the light emitting element BLED illustrated in FIG. 13, the light emitting element substrate SULED has a hexagonal planar shape. The first light emitting part BLED1 is provided near the corner formed by the first side SD1 and the second side SD2 of the light emitting element substrate SULED. The second light emitting part BLED2 is provided near the corner formed by a fifth side SD5 and a sixth side SD6 of the light emitting element substrate SULED. The third light emitting part BLED3 is provided near the corner formed by the third side SD3 and the fourth side SD4 of the light emitting element substrate SULED.

In the light emitting element BLED illustrated in FIG. 13, the first light emitting part BLED1, the second light emitting part BLED2, and the third light emitting part BLED3 are disposed so as to be equivalent in the positional relation between the light emitting parts and the sides of the light emitting element substrate SULED. The positional relation between the first light emitting part BLED1 and the group of the first side SD1 and the second side SD2 is equivalent to that between the second light emitting part BLED2 and the group of the fifth side SD5 and the sixth side SD6. As a result, the first light emitting part BLED1, the second light emitting part BLED2, and the third light emitting part BLED3 are provided under the same conditions. Consequently, the present modification can reduce the difference in emission intensity.

Fourth Modification of the First Embodiment

Figure 14:
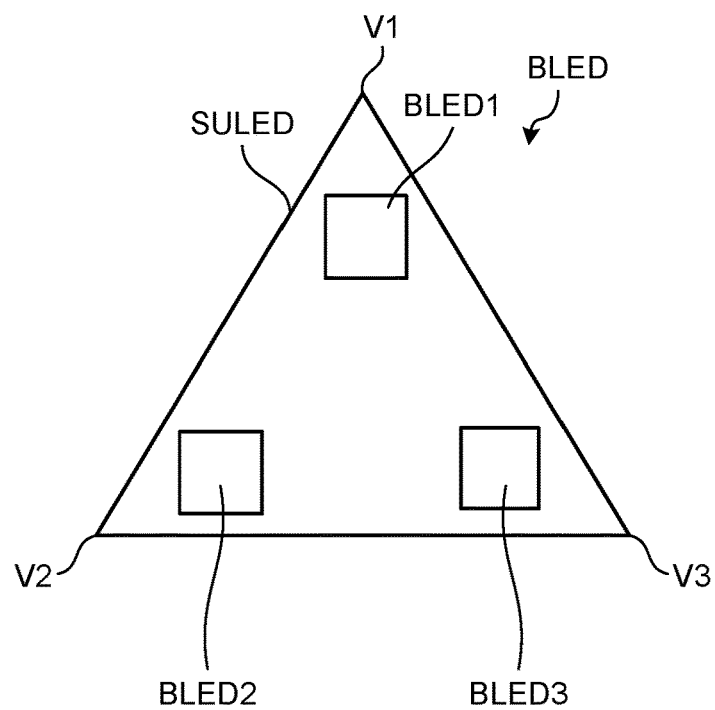
FIG. 14 is a plan view of the light emitting element according to a fourth modification of the first embodiment.

FIG. 14 is a plan view of the light emitting element according to a fourth modification of the first embodiment. In the light emitting element BLED illustrated in FIG. 14, the light emitting element substrate SULED has a triangular planar shape. The first light emitting part BLED1 is provided near a first apex V1 of the light emitting element substrate SULED. The second light emitting part BLED2 is provided near a second apex V2 of the light emitting element substrate SULED. The third light emitting part BLED3 is provided near a third apex V3 of the light emitting element substrate SULED. With the structure according to the fourth modification, a larger number of light emitting elements BLED can be obtained from one light emitting element substrate SULED in the process for manufacturing the light emitting element BLED.

The planar shape of the light emitting element BLED, that is, the planar shape of the light emitting element substrate SULED is not limited to the examples described above. The light emitting element substrate SULED may have a polygonal shape other than triangular, square, and hexagonal shapes. Alternatively, the outer shape of the light emitting element substrate SULED may be a circle and partially have a curved part.

Figure 15:
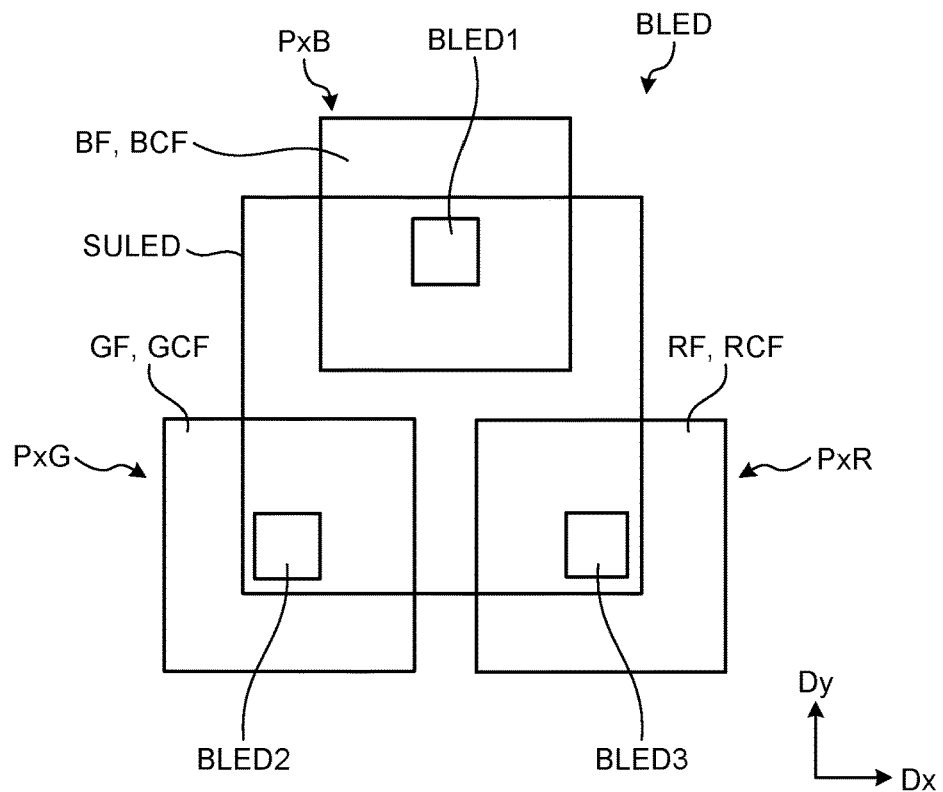
FIG. 15 is a plan view illustrating the relation between the light emitting element and a plurality of pixels according to the first embodiment.

The following describes the positional relation between the light emitting element BLED and a plurality of pixels Px in planar view. FIG. 15 is a plan view illustrating the relation between the light emitting element and a plurality of pixels according to the first embodiment. The light emitting element BLED illustrated in FIG. 15 is the same as the light emitting element BLED illustrated in FIG. 12, and detailed explanation thereof is omitted. The second pixel PxG and the third pixel PxR are disposed side by side in the first direction Dx. The first pixel PxB and the group of the second pixel PxG and the third pixel PxR are disposed side by side in the second direction Dy. The position of the first pixel PxB in the first direction Dx deviates from that of the second pixel PxG and the third pixel PxR in the first direction Dx. By disposing a plurality of combinations of the light emitting element BLED, the first pixel PxB, the second pixel PxG, and the third pixel PxR, the pixels Px are disposed in a staggered array.

The first pixel PxB is a region including the first light emitting part BLED1. The second pixel PxG is a region including the second light emitting part BLED2. The third pixel PxR is a region including the third light emitting part BLED3. The first light emitting part BLED1, the second light emitting part BLED2, and the third light emitting part BLED3 are positioned at the center of the phosphor layers BF, GF, and RF, respectively. In other words, the light emitting element substrate SULED of the light emitting element BLED is disposed over the three pixels Px.

Fifth Modification of the First Embodiment

Figure 16:
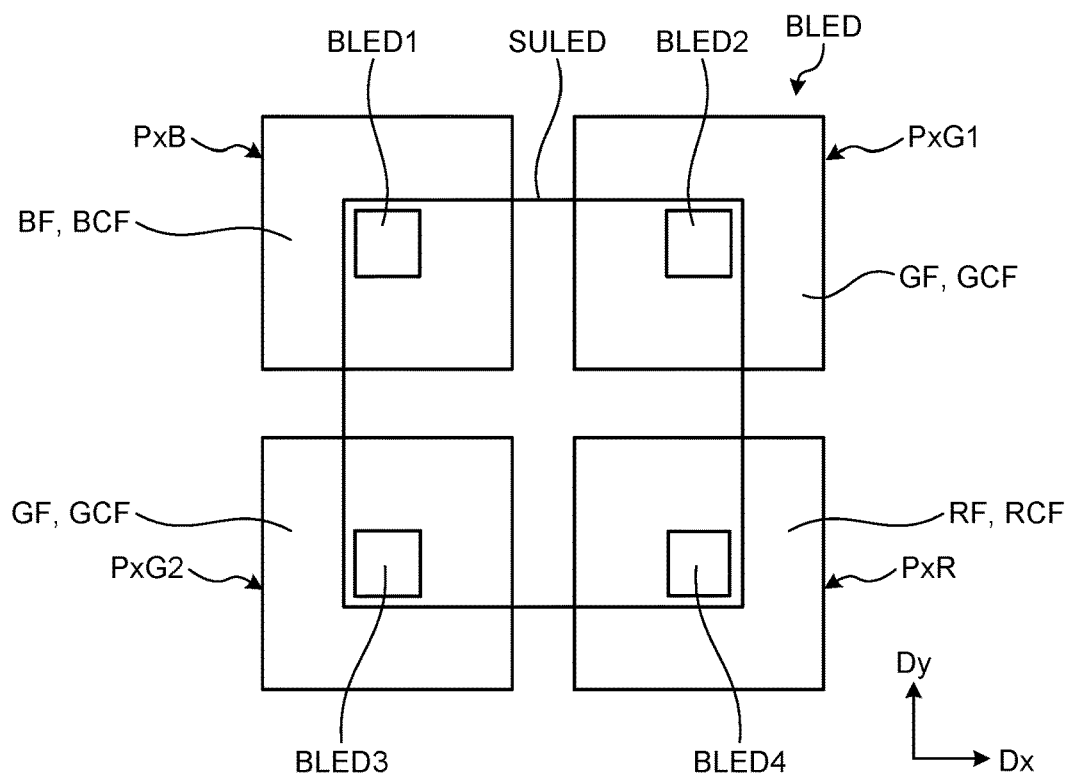
FIG. 16 is a plan view illustrating the relation between the light emitting element and a plurality of pixels according to a fifth modification of the first embodiment.

FIG. 16 is a plan view illustrating the relation between the light emitting element and a plurality of pixels according to a fifth modification of the first embodiment. As illustrated in FIG. 16, the light emitting element BLED according to the fifth modification includes four light emitting parts of the first light emitting part BLED1 to a fourth light emitting part BLED4.

The light emitting element substrate SULED of the light emitting element BLED is disposed over four pixels Px. The four pixels Px are the first pixel PxB, a second pixel PxG1, a second pixel PxG2, and the third pixel PxR. Both the second pixel PxG1 and the second pixel PxG2 output green light. The first pixel PxB and the second pixel PxG1 are disposed side by side in the first direction Dx. The second pixel PxG2 and the third pixel PxR are disposed side by side in the first direction Dx. The first pixel PxB and the second pixel PxG2 are disposed side by side in the second direction Dy. The second pixel PxG1 and the third pixel PxR are disposed side by side in the second direction Dy. By disposing a plurality of combinations of the first pixel PxB, the second pixel PxG1, the second pixel PxG2, and the third pixel PxR illustrated in FIG. 16, the pixels Px are disposed in what is called the Bayer array.

The first pixel PxB is a region including the first light emitting part BLED1. The second pixel PxG1 is a region including the second light emitting part BLED2. The second pixel PxG2 is a region including the third light emitting part BLED3. The third pixel PxR is a region including the fourth light emitting part BLED4. The first light emitting part BLED1, the second light emitting part BLED2, the third light emitting part BLED3, and the fourth light emitting part BLED4 are positioned at the center of the phosphor layers BF, GF, GF, and RF, respectively.

Sixth Modification of the First Embodiment

Figure 17:
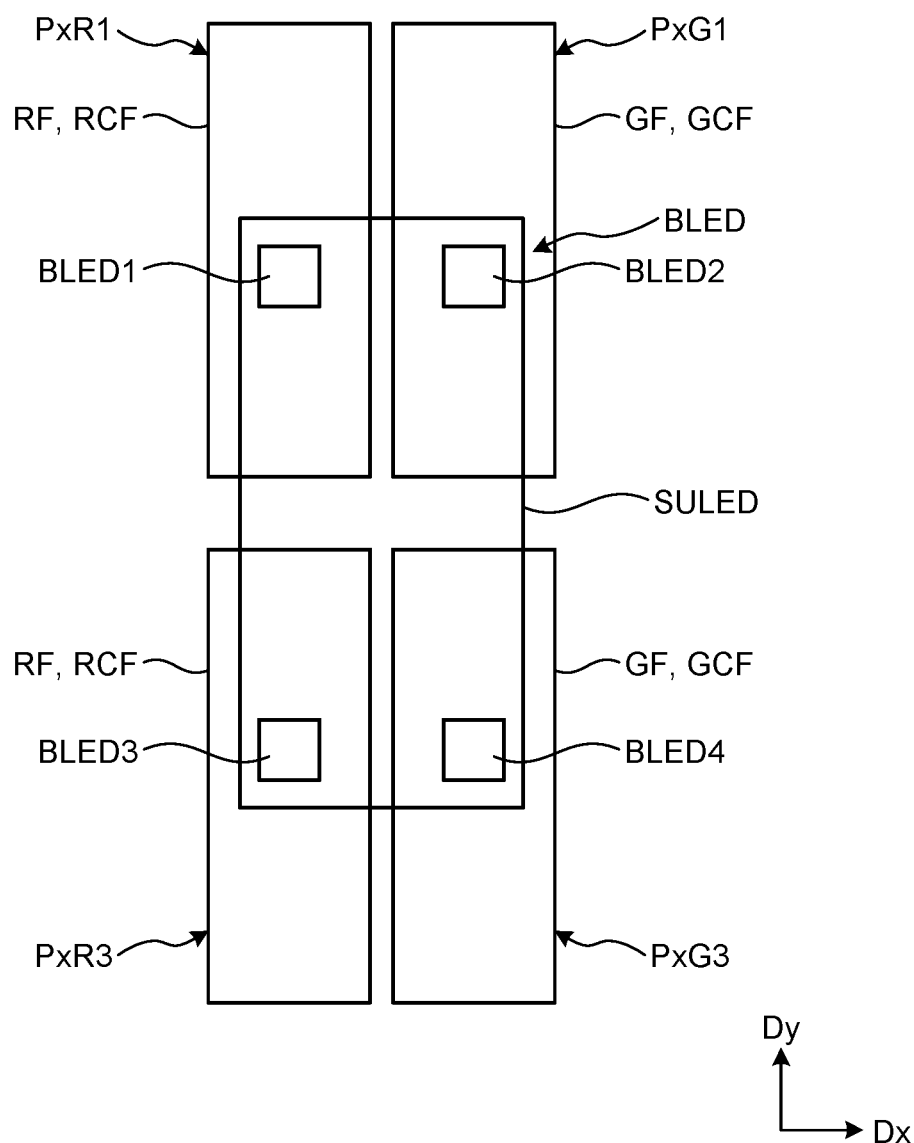
FIG. 17 is a plan view illustrating the relation between the light emitting element and a plurality of pixels according to a sixth modification of the first embodiment.

FIG. 17 is a plan view illustrating the relation between the light emitting element and a plurality of pixels according to a sixth modification of the first embodiment. In the light emitting element BLED according to the sixth modification illustrated in FIG. 17, the light emitting element substrate SULED has a rectangular planar shape. The light emitting element BLED includes four light emitting parts of the first light emitting part BLED1 to the fourth light emitting part BLED4. The first light emitting part BLED1 and the second light emitting part BLED2 are disposed at one side of the light emitting element substrate SULED in the second direction Dy. The third light emitting part BLED3 and the fourth light emitting part BLED4 are disposed at the other side of the light emitting element substrate SULED in the second direction Dy.

The light emitting element substrate SULED of the light emitting element BLED is disposed over four pixels Px. The four pixels Px are two second pixels PxG1 and PxG3 and two third pixels PxR1 and PxR3. The third pixel PxR1 and the second pixel PxG1 are disposed side by side in the first direction Dx. The third pixel PxR3 and the second pixel PxG3 are disposed side by side in the first direction Dx. The third pixel PxR1 and the third pixel PxR3 are disposed side by side in the second direction Dy. The second pixel PxG1 and the second pixel PxG3 are disposed side by side in the second direction Dy.

The two second pixels PxG1 and PxG3 and the two third pixels PxR1 and PxR3 have a rectangular planar shape. In other words, the phosphor layers GF and RF and the color filters GCF and RCF have a rectangular planar shape. The first light emitting part BLED1 to the fourth light emitting part BLED4 are positioned at the center of the respective pixels Px.

Seventh Modification of the First Embodiment

Figure 18:
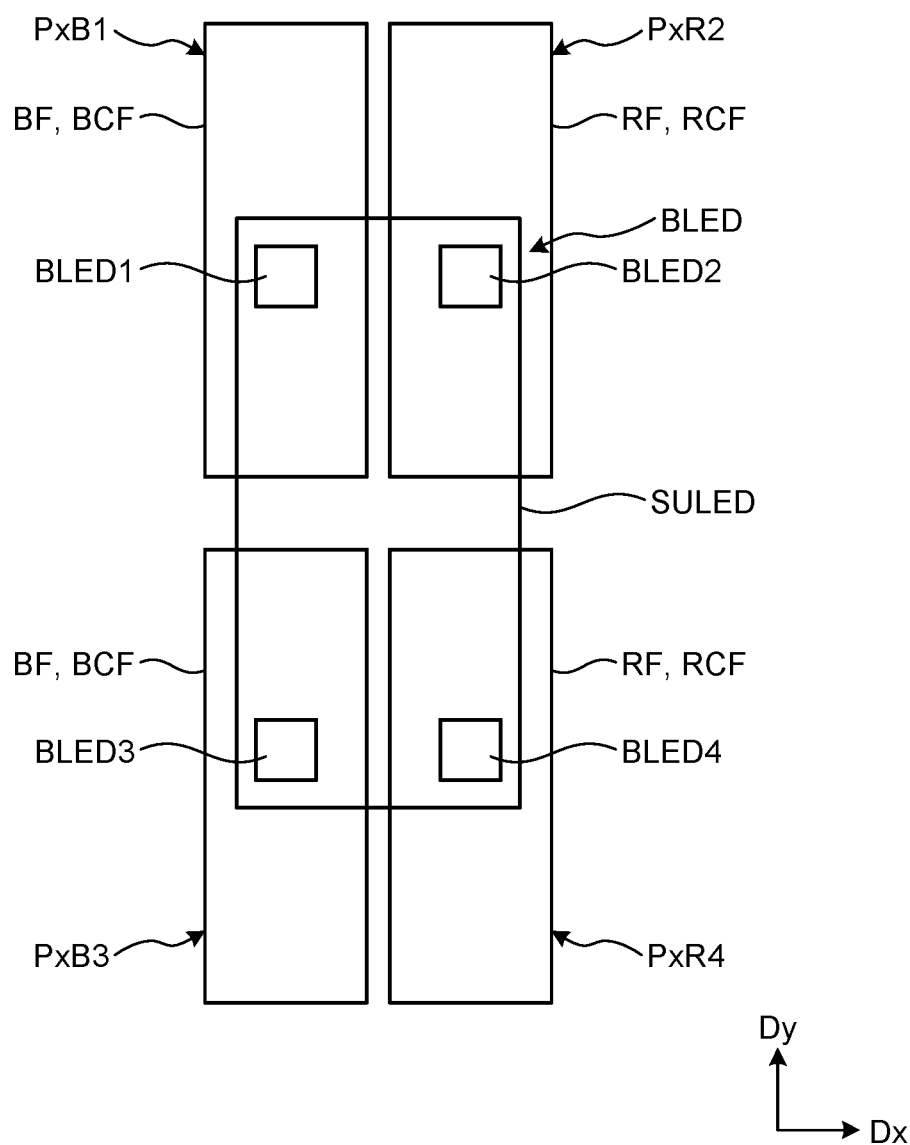
FIG. 18 is a plan view illustrating the relation between the light emitting element and a plurality of pixels according to a seventh modification of the first embodiment.

FIG. 18 is a plan view illustrating the relation between the light emitting element and a plurality of pixels according to a seventh modification of the first embodiment. As illustrated in FIG. 18, the light emitting element BLED according to the seventh modification is the same as that according to the sixth modification illustrated in FIG. 17.

The four pixels Px according to the seventh modification are two first pixels PxB1 and PxB3 and two third pixels PxR2 and PxR4. The first pixel PxB1 and the third pixel PxR2 are disposed side by side in the first direction Dx. The first pixel PxB3 and the third pixel PxR4 are disposed side by side in the first direction Dx. The first pixel PxB1 and the first pixel PxB3 are disposed side by side in the second direction Dy. The third pixel PxR2 and the third pixel PxR4 are disposed side by side in the second direction Dy.

The two first pixels PxB1 and PxB3 and the two third pixels PxR2 and PxR4 have a rectangular planar shape. In other words, the phosphor layers BF and RF and the color filters BCF and RCF have a rectangular planar shape. The first light emitting part BLED1 to the fourth light emitting part BLED4 are positioned at the center of the respective pixels Px.

Eighth Modification of the First Embodiment

Figure 19:
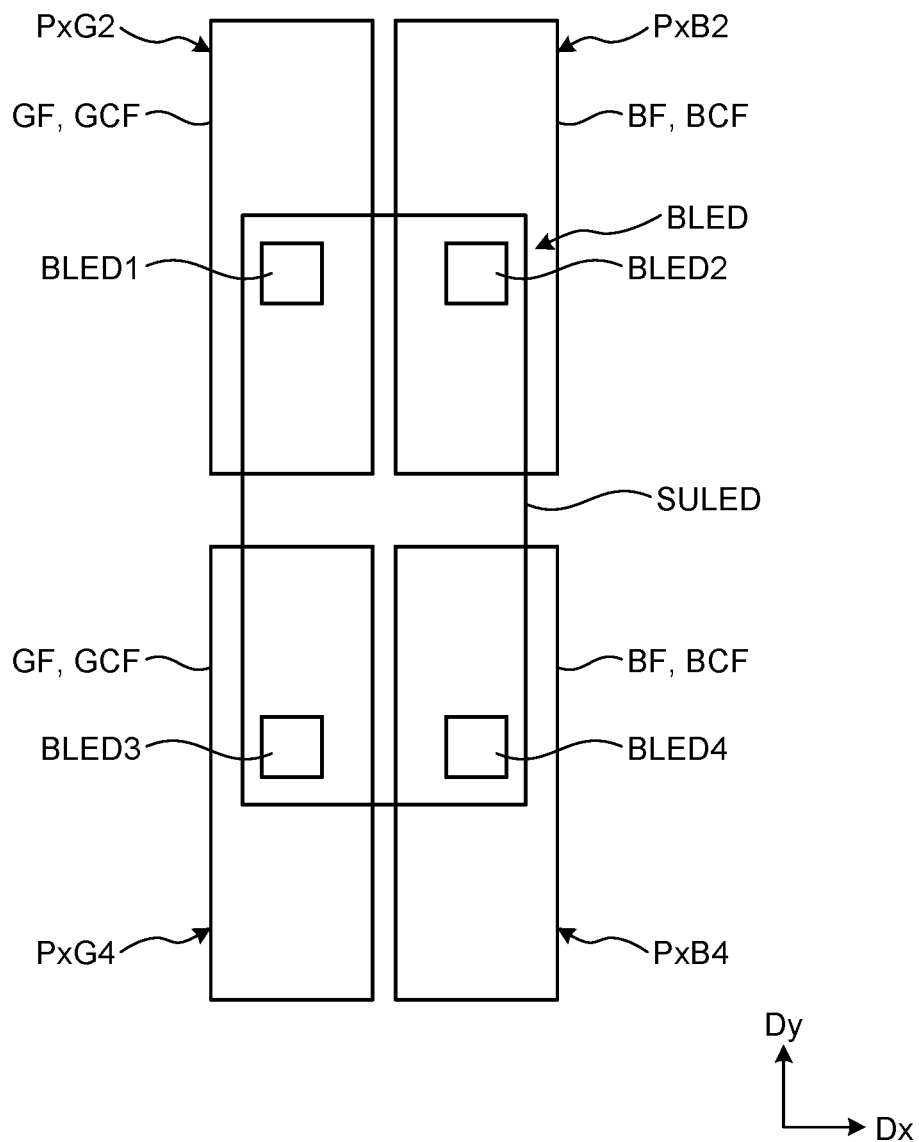
FIG. 19 is a plan view illustrating the relation between the light emitting element and a plurality of pixels according to an eighth modification of the first embodiment.

FIG. 19 is a plan view illustrating the relation between the light emitting element and a plurality of pixels according to an eighth modification of the first embodiment. As illustrated in FIG. 19, the light emitting element BLED according to the eighth modification is the same as that according to the sixth modification illustrated in FIG. 17 and the seventh modification illustrated in FIG. 18.

The four pixels Px according to the eighth modification are two second pixels PxG2 and PxG4 and two first pixels PxB2 and PxB4. The second pixel PxG2 and the first pixel PxB2 are disposed side by side in the first direction Dx. The second pixel PxG4 and the first pixel PxB4 are disposed side by side in the first direction Dx. The second pixel PxG2 and the second pixel PxG4 are disposed side by side in the second direction Dy. The first pixel PxB2 and the first pixel PxB4 are disposed side by side in the second direction Dy.

The two second pixels PxG2 and PxG4 and the two first pixels PxB2 and PxB4 have a rectangular planar shape. In other words, the phosphor layers GF and BF and the color filters GCF and BCF have a rectangular planar shape. The first light emitting part BLED1 to the fourth light emitting part BLED4 are positioned at the center of the respective pixels Px.

By arraying the light emitting elements BLED and the pixels Px according to the sixth to the eighth modifications in the first direction Dx, the pixels Px are arrayed in the first direction Dx in order of the third pixel PxR1, the second pixel PxG1, the first pixel PxB1, the third pixel PxR2, the second pixel PxG2, and the first pixel PxB2. The pixels Px are also arrayed in the first direction Dx in order of the third pixel PxR3, the second pixel PxG3, the first pixel PxB3, the third pixel PxR4, the second pixel PxG4, and the first pixel PxB4. By arraying the same combinations of the light emitting elements BLED and the pixels Px in the second direction Dy, the pixels Px in the same color are arrayed in the second direction Dy. Consequently, the display device DSP has a stripe pixel array.

Second Embodiment

Figure 20:
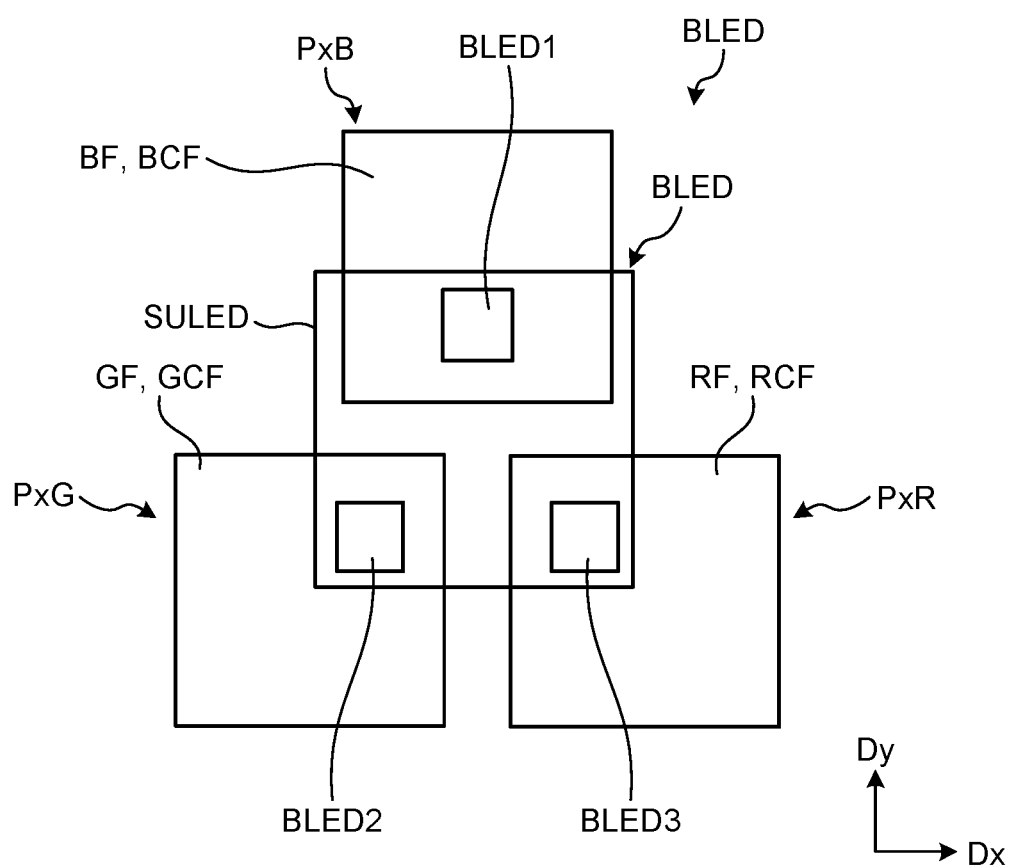
FIG. 20 is a plan view of a plurality of pixels according to a second embodiment.
Figure 21:
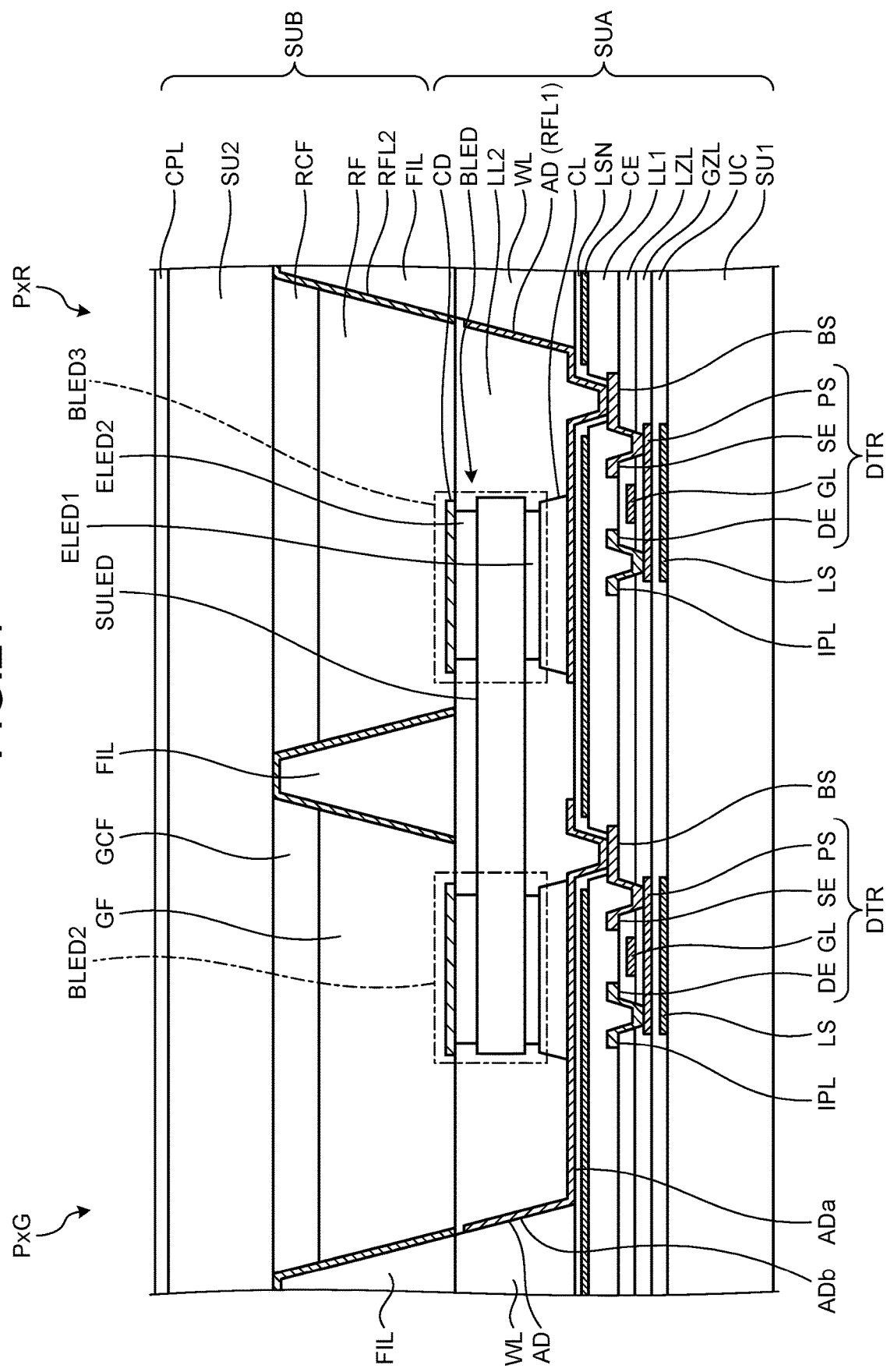
FIG. 21 is a sectional view of the display device according to the second embodiment.

FIG. 20 is a plan view of a plurality of pixels according to a second embodiment. FIG. 21 is a sectional view of the display device according to the second embodiment. In the light emitting element BLED according to the second embodiment illustrated in FIG. 20, the positional relation between the light emitting element substrate SULED and three light emitting parts (the first light emitting part BLED1, the second light emitting part BLED2, and the third light emitting part BLED3) is the same as that according to the first embodiment illustrated in FIGS. 12 and 15.

The first light emitting part BLED1 is disposed not at the center but at an outer end of the first pixel PxB. Specifically, the first light emitting part BLED1 is disposed near the side of the first pixel PxB adjacent to the second pixel PxG and the third pixel PxR. The second light emitting part BLED2 is disposed not at the center but at an outer end of the second pixel PxG. Specifically, the second light emitting part BLED2 is disposed near the corner of the second pixel PxG formed by the side adjacent to the first pixel PxB and the side adjacent to the third pixel PxR. The third light emitting part BLED3 is disposed not at the center but at an outer end of the third pixel PxR. Specifically, the third light emitting part BLED3 is disposed near the corner of the third pixel PxR formed by the side adjacent to the first pixel PxB and the side adjacent to the second pixel PxG.

In the following description with reference to FIG. 20, one side in the first direction Dx may be referred to as right, the other side in the first direction Dx may be referred to as left, one side in the second direction Dy may be referred to as up, and the other side in the second direction Dy may be referred to as down. The first light emitting part BLED1, for example, is disposed at the lower end of the first pixel PxB. The second light emitting part BLED2 is disposed at the upper right end of the second pixel PxG. The third light emitting part BLED3 is disposed at the upper left end of the third pixel PxR.

By disposing a plurality of combinations of the light emitting element BLED, the first pixel PxB, the second pixel PxG, and the third pixel PxR illustrated in FIG. 20, the pixels Px are disposed in a staggered array similarly to the first embodiment.

As illustrated in FIG. 21, the second light emitting part BLED2 and the third light emitting part BLED3 are disposed closer to the filling layer FIL and the second reflective layer RFL2 disposed between the second pixel PxG and the third pixel PxR. In other words, the second light emitting part BLED2 and the third light emitting part BLED3 are disposed farther away from the anode electrode inclining part ADb and closer to the center of the recessed structure formed by the anode electrode AD and the second reflective layer RFL2 than those according to the first embodiment. The distance between the end of the phosphor layer GF adjacent to the phosphor layer RF and the second light emitting part BLED2 in the direction parallel to the first substrate SU1 is shorter than the distance between the anode electrode inclining part ADb and the second light emitting part BLED2. As a result, the anode electrode bottom parts ADa each extend to the outer periphery of the corresponding pixel Px.

The second embodiment enables downsizing the light emitting element BLED in planar view compared with the first embodiment. In this case, the positions of the light emitting parts (the first light emitting part BLED1, the second light emitting part BLED2, and the third light emitting part BLED3) deviate in the respective pixels Px. In the first pixel PxB illustrated in FIG. 20, for example, most of light output from the first light emitting part BLED1 is reflected by the anode electrode AD near the first light emitting part BLED1, travels upward in FIG. 20, and passes through the phosphor layer BF. As a result, the direction of light passing through the phosphor layer BF deviates to the upper direction in FIG. 20.

In the second pixel PxG, the direction of light passing through the phosphor layer GF deviates to the lower left direction in FIG. 20. In the third pixel PxR, the direction of light passing through the phosphor layer RF deviates to the lower right direction in FIG. 20.

All the phosphor layers BF, GF, and RF isotropically emit light. The deviation in the traveling direction of light output from the light emitting parts (the first light emitting part BLED1, the second light emitting part BLED2, and the third light emitting part BLED3) is cancelled when the light is absorbed and subjected to wavelength conversion in the phosphor layers BF, GF, and RF. As a result, light emission in the phosphor layers BF, GF, and RF are isotropically distributed. Consequently, the display device DSP can prevent the deviation in the angular distribution of light output from the pixels Px.

The second embodiment enables downsizing the light emitting element BLED. Consequently, the second embodiment can increase the number of elements that can be formed by one light emitting element substrate SULED in the process for manufacturing the light emitting element BLED. The light beams output from the light emitting parts pass through the phosphor layers BF, GF, and RF and the color filters BCF, GCF, and RCF, respectively. Consequently, the display device DSP can obtain display characteristics equivalent to those according to the first embodiment.

Ninth Modification of the Second Embodiment

Figure 22:
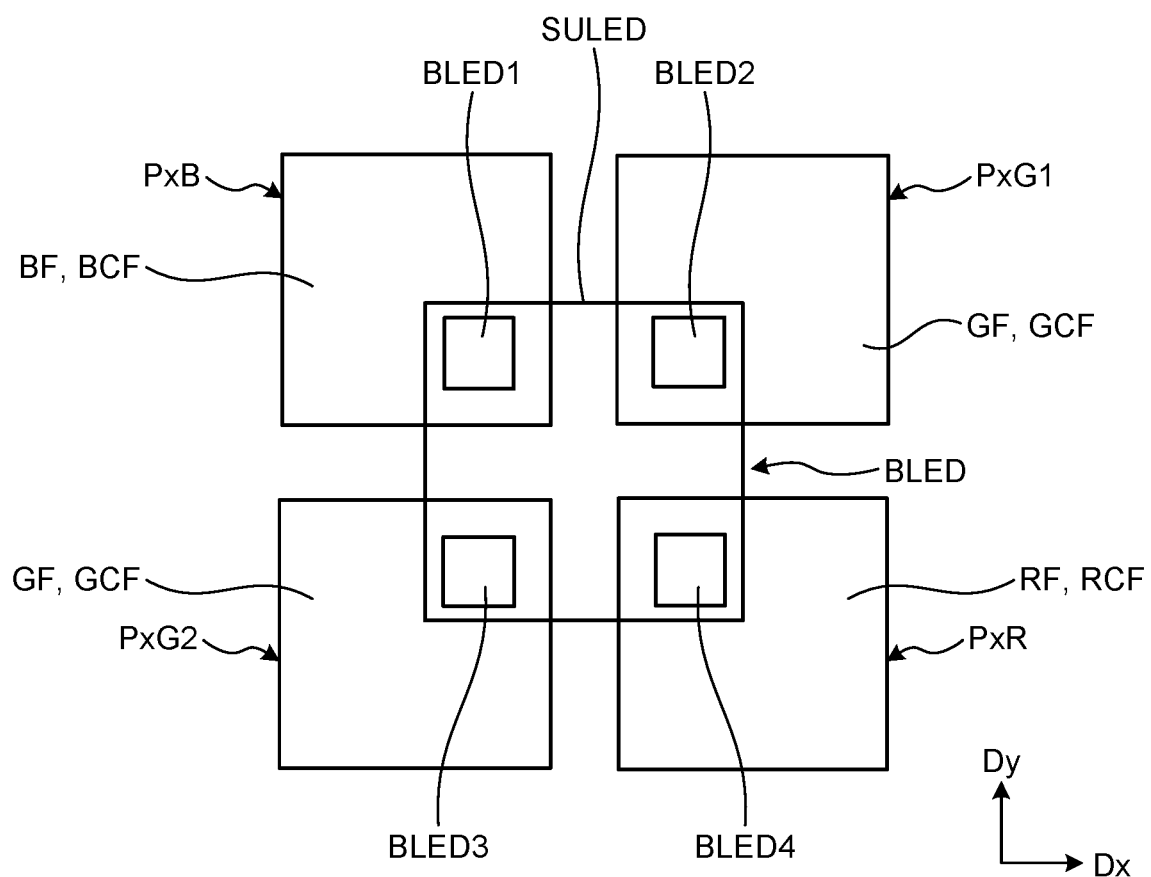
FIG. 22 is a plan view illustrating the relation between the light emitting element and a plurality of pixels according to a ninth modification of the second embodiment.

FIG. 22 is a plan view illustrating the relation between the light emitting element and a plurality of pixels according to a ninth modification of the second embodiment. The positional relation between the light emitting parts and the pixels Px according to the ninth modification is the same as that according to the fifth modification illustrated in FIG. 16. The pixels Px are disposed in what is called the Bayer array.

The light emitting element BLED according to the ninth modification is downsized compared with the fifth modification. In other words, the light emitting parts overlap the ends of the respective pixels Px and are each provided at a position deviated from the center of the corresponding pixel Px. The first light emitting part BLED1 is disposed at the lower right end of the first pixel PxB. The second light emitting part BLED2 is disposed at the lower left end of the second pixel PxG1. The third light emitting part BLED3 is disposed at the upper right end of the second pixel PxG2. The fourth light emitting part BLED4 is disposed at the upper left end of the third pixel PxR.

Tenth Modification of the Second Embodiment

Figure 23:
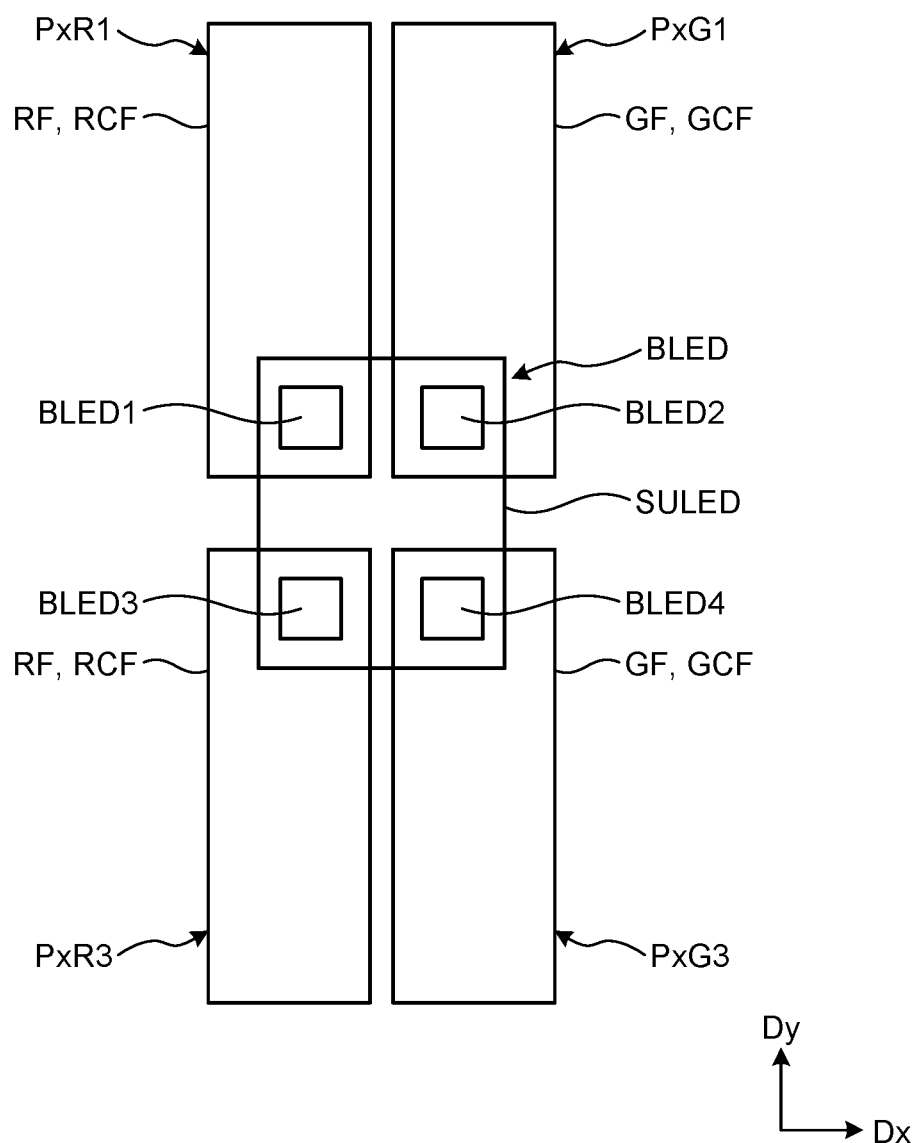
FIG. 23 is a plan view illustrating the relation between the light emitting element and a plurality of pixels according to a tenth modification of the second embodiment.

FIG. 23 is a plan view illustrating the relation between the light emitting element and a plurality of pixels according to a tenth modification of the second embodiment. The positional relation between the light emitting parts and the pixels Px according to the tenth modification is the same as that according to the sixth modification illustrated in FIG. 17.

The light emitting element BLED according to the tenth modification is downsized compared with the sixth modification. In other words, the light emitting element substrate SULED overlaps the ends of the respective pixels Px and does not overlap the centers of the respective pixels Px. The first light emitting part BLED1 is disposed at the lower right end of the third pixel PxR1. The second light emitting part BLED2 is disposed at the lower left end of the second pixel PxG1. The third light emitting part BLED3 is disposed at the upper right end of the third pixel PxR3. The fourth light emitting part BLED4 is disposed at the upper left end of the second pixel PxG3.

Eleventh Modification of the Second Embodiment

Figure 24:
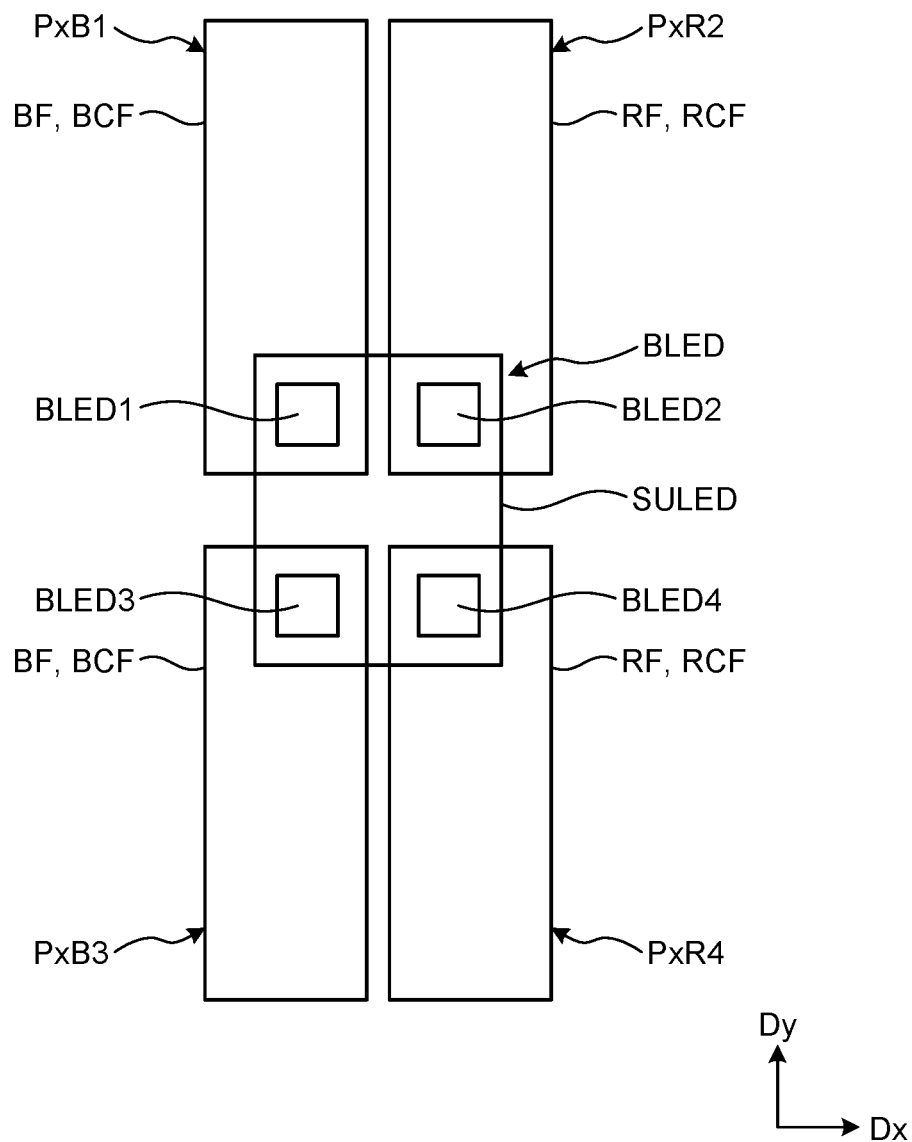
FIG. 24 is a plan view illustrating the relation between the light emitting element and a plurality of pixels according to an eleventh modification of the second embodiment.

FIG. 24 is a plan view illustrating the relation between the light emitting element and a plurality of pixels according to an eleventh modification of the second embodiment. The positional relation between the light emitting parts and the pixels Px according to the eleventh modification is the same as that according to the seventh modification illustrated in FIG. 18.

The light emitting element BLED according to the eleventh modification is downsized compared with the seventh modification. In other words, the first light emitting part BLED1 is disposed at the lower right end of the first pixel PxB1. The second light emitting part BLED2 is disposed at the lower left end of the third pixel PxR2. The third light emitting part BLED3 is disposed at the upper right end of the first pixel PxB3. The fourth light emitting part BLED4 is disposed at the upper left end of the third pixel PxR4.

Twelfth Modification of the Second Embodiment

Figure 25:
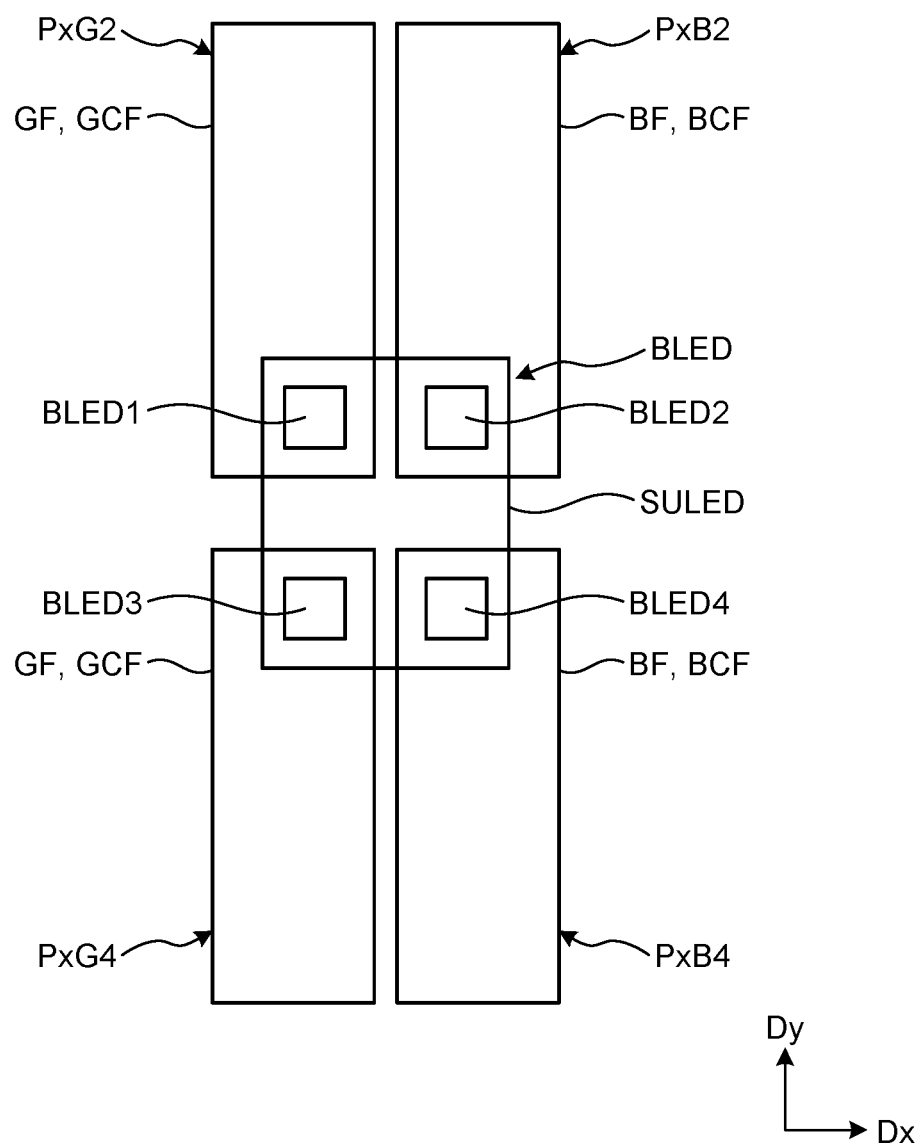
FIG. 25 is a plan view illustrating the relation between the light emitting element and a plurality of pixels according to a twelfth modification of the second embodiment.

FIG. 25 is a plan view illustrating the relation between the light emitting element and a plurality of pixels according to a twelfth modification of the second embodiment. The positional relation between the light emitting parts and the pixels Px according to the twelfth modification is the same as that according to the eighth modification illustrated in FIG. 19.

The light emitting element BLED according to the twelfth modification is downsized compared with the eighth modification. In other words, the first light emitting part BLED1 is disposed at the lower right end of the second pixel PxG2. The second light emitting part BLED2 is disposed at the lower left end of the first pixel PxB2. The third light emitting part BLED3 is disposed at the upper right end of the second pixel PxG4. The fourth light emitting part BLED4 is disposed at the upper left end of the first pixel PxB4.

By arraying the light emitting elements BLED and the pixels Px according to the tenth to the twelfth modifications in the first direction Dx and the second direction Dy, the display device DSP has a stripe pixel array similarly to the sixth to the eighth modifications. While the pixels Px have a rectangular shape, lights output from the light emitting parts pass through the respective phosphor layers BF, GF, and RF, thereby being output in an isotropically distributed manner. Consequently, the display device DSP can prevent the deviation in the angular distribution of light output from the pixels Px and obtain display characteristics equivalent to those according to the first embodiment.

Third Embodiment

Figure 26:
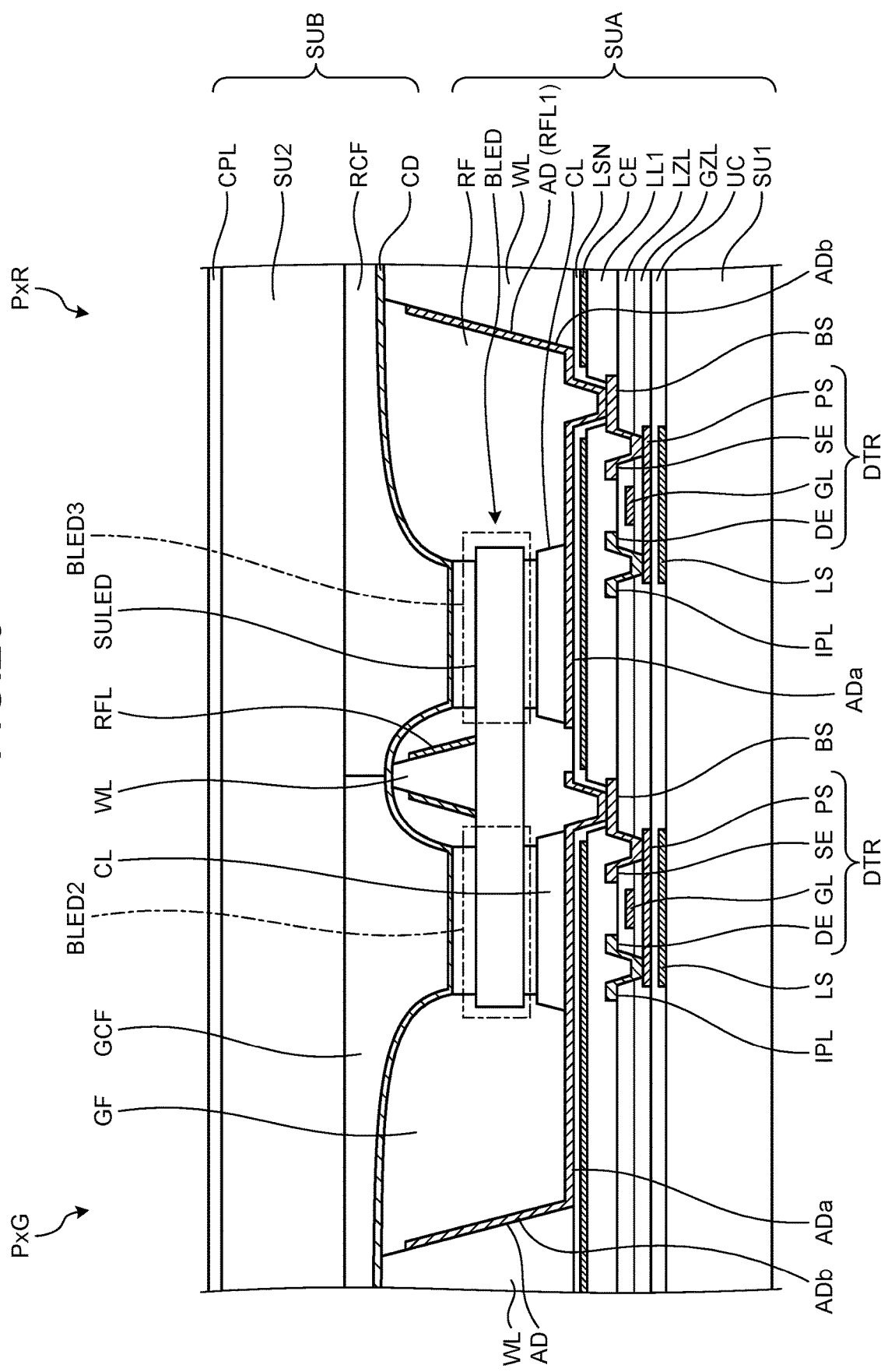
FIG. 26 is a sectional view of the display device according to a third embodiment.

FIG. 26 is a sectional view of the display device according to a third embodiment. As illustrated in FIG. 26, the light emitting part BLED according to the third embodiment can be further downsized compared with the second embodiment while maintaining the size of the light emitting parts (the first light emitting part BLED1, the second light emitting part BLED2, and the third light emitting part BLED3). FIG. 26 illustrates a sectional structure of the second light emitting part BLED2 and the third light emitting part BLED3. Explanation of the second light emitting part BLED2 and the third light emitting part BLED3 is also applicable to the first light emitting part BLED1.

A wall structure WL (light emitting element wall structure) is provided between the second light emitting part BLED2 and the third light emitting part BLED3 on the light emitting element substrate SULED. The side surfaces of the wall structure WL are provided with reflective layers RFL. If the distance between the second light emitting part BLED2 and the third light emitting part BLED3 is reduced, this configuration can prevent color mixture of light output from them.

In the configuration according to the third embodiment, the phosphor layers GF and RF are provided instead of the second flattening layer LL2 (refer to FIG. 10) according to the second embodiment. In other words, the phosphor layers GF and RF are included in the array substrate SUA. In the second pixel PxG, the phosphor layer GF is provided in the recessed structure of the anode electrode AD and provided between the light emitting element BLED and the anode electrode AD in a manner covering the side surfaces of the second light emitting part BLED2. The height of the phosphor layer GF is higher than that of the second light emitting part BLED2. The phosphor layer GF is provided covering the upper end of the anode electrode inclining part ADb and the upper end of the inner wall of the wall structure WL. The phosphor layer GF is provided covering the wall structure WL and the reflective layer RFL on the light emitting element substrate SULED. The color filter GCF is provided overlapping the upper surface of the second light emitting part BLED2 and the phosphor layer GF.

In the third pixel PxR, the phosphor layer RF is provided in the recessed structure of the anode electrode AD and covers the side surfaces of the third light emitting part BLED3. The height of the phosphor layer RF is higher than that of the third light emitting part BLED3. The phosphor layer RF is provided covering the upper end of the anode electrode inclining part ADb and the upper end of the inner wall of the wall structure WL. The phosphor layer RF is provided covering the wall structure WL and the reflective layer RFL on the light emitting element substrate SULED. The color filter RCF is provided overlapping the upper surface of the third light emitting part BLED3 and the phosphor layer RF.

The cathode electrode CD is provided on the upper surface of the second light emitting part BLED2, the upper surface of the phosphor layer GF, the upper surface of the third light emitting part BLED3, and the upper surface of the phosphor layer RF. The cathode electrode CD continuously extends over a plurality of pixels Px. The phosphor layer GF is not provided on the upper surface of the second light emitting part BLED2, and the phosphor layer RF is not provided on the upper surface of the third light emitting part BLED3. The cathode electrode CD is coupled to the upper surface of the second light emitting part BLED2 and the upper surface of the third light emitting part BLED3 exposed from the phosphor layers GF and RF.

Light output from the side surfaces of the second light emitting part BLED2 is directly incident on the phosphor layer GF and subjected to wavelength conversion. Part of light emitted in the phosphor layer GF is incident on the color filter GCF and output toward the second substrate SU2. Light output toward the first substrate SU1 in the light emitted in the phosphor layer GF is reflected by the anode electrode AD, passes through the color filter GCF, and is output toward the second substrate SU2.

Light output from the side surfaces of the third light emitting part BLED3 is directly incident on the phosphor layer RF and subjected to wavelength conversion. Part of light emitted in the phosphor layer RF is incident on the color filter RCF and output toward the second substrate SU2. Light output toward the first substrate SU1 in the light emitted in the phosphor layer RF is reflected by the anode electrode AD, passes through the color filter RCF, and is output toward the second substrate SU2.

If the light emitting element BLED is downsized, the display device DSP can increase the light extraction efficiency of the light emitting element BLED with the anode electrode AD and the phosphor layers BF, GF, and RF (the phosphor layer BF is not illustrated in FIG. 26).

Thirteenth Modification of the Third Embodiment

FIG. 27 is a sectional view of the display device according to a thirteenth modification of the third embodiment. As illustrated in FIG. 27, the second pixel PxG includes a first phosphor layer GF1 and a second phosphor layer GF2. The first phosphor layer GF1 is provided in the recessed structure of the anode electrode AD and covers the side surfaces of the second light emitting part BLED2 similarly to the phosphor layer GF according to the third embodiment. The second phosphor layer GF2 is provided overlapping the upper surface of the second light emitting part BLED2 and the upper surface of the first phosphor layer GF1. The second phosphor layer GF2 is provided so as to flatten the difference in height between the second light emitting part BLED2 and the first phosphor layer GF1. The upper surface of the second phosphor layer GF2 is flat, and the color filter GCF is provided on the second phosphor layer GF2.

Similarly, the third pixel PxR includes a first phosphor layer RF1 and a second phosphor layer RF2. The first phosphor layer RF1 is provided in the recessed structure of the anode electrode AD and provided between the light emitting element BLED and the anode electrode AD in a manner covering the side surfaces of the third light emitting part BLED3 similarly to the phosphor layer RF according to the third embodiment. The second phosphor layer RF2 is provided overlapping the upper surface of the third light emitting part BLED3 and the upper surface of the first phosphor layer RF1. The second phosphor layer RF2 is provided so as to flatten the difference in height between the third light emitting part BLED3 and the first phosphor layer RF1. The upper surface of the second phosphor layer RF2 is flat, and the color filter RCF is provided on the second phosphor layer RF2.

The cathode electrode CD is provided between the group of the second phosphor layer GF2 and the second phosphor layer RF2 and the group of the first phosphor layer GF1, the second light emitting part BLED2, the first phosphor layer RF1, and the third light emitting part BLED3. The cathode electrode CD continuously extends over a plurality of pixels Px.

With this configuration, light output from the upper surface of the second light emitting part BLED2 is incident on the second phosphor layer GF2 and subjected to wavelength conversion. This configuration reduces the amount of components of light absorbed by the color filter GCF and can increase the light extraction efficiency of the second light emitting part BLED2.

Similarly, light output from the upper surface of the third light emitting part BLED3 is incident on the second phosphor layer RF2 and subjected to wavelength conversion. This configuration reduces the amount of components of light absorbed by the color filter RCF and can increase the light extraction efficiency of the third light emitting part BLED3.

The first pixel PxB, which is not illustrated in FIG. 27, also includes a first phosphor layer BF1 and a second phosphor layer BF2. Light output from the first light emitting part BLED1 is absorbed by the first phosphor layer BF1 and the second phosphor layer BF2 and emitted isotropically. As a result, blue light output from the first pixel PxB has the same angular distribution as that of green light output from the second pixel PxG and red light output from the third pixel PxR. Consequently, the display device DSP can obtain excellent display characteristics.

The third embodiment and the thirteenth modifications may also have the configurations according to the first to the twelfth modifications.

While an exemplary embodiment according to the present disclosure has been described, the embodiment is not intended to limit the disclosure. The contents disclosed in the embodiment are given by way of example only, and various changes may be made without departing from the spirit of the present disclosure. Appropriate changes made without departing from the spirit of the present disclosure naturally fall within the technical scope of the disclosure. At least one of various omissions, substitutions, and changes of the components may be made without departing from the gist of the embodiment above and the modifications thereof.

What is claimed is:

1. A display device comprising:
    a first substrate;
    a plurality of pixels provided to the first substrate;
    a light emitting element comprising a light emitting element substrate provided over the pixels and a plurality of light emitting parts provided to the light emitting element substrate corresponding to the respective pixels;
    an anode electrode provided to the first substrate and electrically coupled to the light emitting element;
    a plurality of phosphor layers provided to the respective light emitting parts and each covering at least part of the corresponding light emitting part;
    a first reflective layer facing a side surface of the light emitting element; and
    a second reflective layer provided to a side surface of the phosphor layer, separated from the first reflective layer in a normal direction of the first substrate, and disposed farther away from the first substrate than the first reflective layer.

2. The display device according to claim 1, wherein the pixels include a first pixel configured to display a first color, a second pixel configured to display a second color different from the first color, and a third pixel configured to display a third color different from the first color and the second color, and the light emitting parts output light in the same color and includes a first light emitting part included in the first pixel, a second light emitting part included in the second pixel, and a third light emitting part included in the third pixel.

3. The display device according to claim 1, wherein the phosphor layers include a first color phosphor layer configured to absorb light output from the light emitting part and emit a first color, a second color phosphor layer configured to absorb light output from the light emitting part and emit a second color, and a third color phosphor layer configured to absorb light output from the light emitting part and emit a third color.

4. The display device according to claim 1, wherein the first reflective layer and the second reflective layer incline with respect to the normal direction of the first substrate.

5. The display device according to claim 1, further comprising a wall structure facing the side surface of the light emitting element, wherein
the first reflective layer comprises:
a bottom part extending from a region overlapping the light emitting element to around the light emitting element; and
an inclining part coupled to the bottom part, provided along a wall surface of the wall structure, and inclining with respect to the normal direction of the first substrate.

6. The display device according to claim 1, wherein the first reflective layer is a plurality of the anode electrodes electrically coupled to the respective light emitting parts.

7. The display device according to claim 1, further comprising a color filter provided on the phosphor layer, wherein
the second reflective layer is provided over the side surface of the phosphor layer and a side surface of the color filter.

8. The display device according to claim 1, wherein the second reflective layer is provided between the phosphor layers on the light emitting element substrate.

9. The display device according to claim 1, further comprising a flattening layer covering the side surface of the light emitting element and provided between the light emitting element and the first reflective layer, wherein
the phosphor layer is provided on the flattening layer.

10. The display device according to claim 1, further comprising a second substrate facing the first substrate, wherein
the phosphor layer and the second reflective layer are provided to a surface of the second substrate facing the first substrate, and the first reflective layer and the light emitting element are provided to a surface of the first substrate facing the second substrate.

11. The display device according to claim 1, wherein the light emitting parts are provided at an outer end of the respective pixels in planar view.

12. A display device comprising:
a first substrate;
a plurality of pixels provided to the first substrate;
a light emitting element comprising a light emitting element substrate provided over the pixels and a plurality of light emitting parts provided to the light emitting element substrate corresponding to the respective pixels;
an anode electrode provided to the first substrate and electrically coupled to the light emitting element;
a plurality of phosphor layers provided to the respective light emitting parts and each covering at least part of the corresponding light emitting part; and
a first reflective layer facing a side surface of the light emitting element, wherein
the phosphor layer covers a side surface of the light emitting part and is provided between the light emitting element and the first reflective layer.

13. The display device according to claim 12, further comprising a light emitting element wall structure provided between the light emitting parts on the light emitting element substrate.

14. A display device comprising:
a first substrate;
a plurality of pixels provided to the first substrate;
a light emitting element comprising a light emitting element substrate provided over the pixels and a plurality of light emitting parts provided to the light emitting element substrate corresponding to the respective pixels;
an anode electrode provided to the first substrate and electrically coupled to the light emitting element;
a plurality of phosphor layers provided to the respective light emitting parts and each covering at least part of the corresponding light emitting part; and
a first reflective layer facing a side surface of the light emitting element, wherein
the phosphor layer comprises a first phosphor layer and a second phosphor layer,
the first phosphor layer covers a side surface of the light emitting part and is provided between the light emitting element and the first reflective layer, and
the second phosphor layer covers an upper surface of the light emitting part and is provided on the first phosphor layer.

* * * * *